(12) United States Patent
More

(10) Patent No.: US 11,515,215 B2
(45) Date of Patent: Nov. 29, 2022

(54) ASYMMETRIC EPITAXY REGIONS FOR LANDING CONTACT PLUG

(71) Applicant: Taiwan Semiconductor Manufacturing Co., Ltd., Hsinchu (TW)

(72) Inventor: Shahaji B. More, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 31 days.

(21) Appl. No.: 17/126,737

(22) Filed: Dec. 18, 2020

(65) Prior Publication Data

US 2022/0051948 A1 Feb. 17, 2022

Related U.S. Application Data

(60) Provisional application No. 63/078,967, filed on Sep. 16, 2020, provisional application No. 63/065,267, filed on Aug. 13, 2020.

(51) Int. Cl.
*H01L 21/8238* (2006.01)
*H01L 27/092* (2006.01)
(Continued)

(52) U.S. Cl.
CPC ........ *H01L 21/823814* (2013.01); *H01L 21/28518* (2013.01); *H01L 21/823821* (2013.01);
(Continued)

(58) Field of Classification Search
CPC ....... H01L 21/823814; H01L 21/28518; H01L 21/823821; H01L 21/823871;
(Continued)

(56) References Cited

U.S. PATENT DOCUMENTS 10,658,463 B2 * 5/2020 Jung ..................... H01L 29/165
11,037,827 B2 * 6/2021 Huang .............. H01L 29/66795
(Continued)

FOREIGN PATENT DOCUMENTS

| CN | 107123685 A | 9/2017 |
|---|---|---|
| KR | 20160126292 A | 11/2016 |
| TW | 201830494 A | 8/2018 |

*Primary Examiner* — Karen Kusumakar
*Assistant Examiner* — Adam S Bowen
(74) *Attorney, Agent, or Firm* — Slater Matsil, LLP

(57) ABSTRACT

A method includes forming isolation regions extending into a semiconductor substrate, and forming a first plurality of protruding fins and a second protruding fin over the isolation regions. The first plurality of protruding fins include an outer fin farthest from the second protruding fin, and an inner fin closest to the second protruding fin. The method further includes etching the first plurality of protruding fins to form first recesses, growing first epitaxy regions from the first recesses, wherein the first epitaxy regions are merged to form a merged epitaxy region, etching the second protruding fin to form a second recess, and growing a second epitaxy region from the second recess. A top surface of the merged epitaxy region is lower on a side facing toward the second epitaxy region than on a side facing away from the second epitaxy region.

19 Claims, 19 Drawing Sheets

(51) Int. Cl.
  *H01L 29/06*   (2006.01)
  *H01L 29/08*   (2006.01)
  *H01L 29/417*  (2006.01)
  *H01L 29/45*   (2006.01)
  *H01L 29/66*   (2006.01)
  *H01L 29/78*   (2006.01)
  *H01L 21/285*  (2006.01)

(52) U.S. Cl.
  CPC ........... *H01L 21/823871* (2013.01); *H01L 21/823878* (2013.01); *H01L 27/0924* (2013.01); *H01L 29/0653* (2013.01); *H01L 29/0847* (2013.01); *H01L 29/41791* (2013.01); *H01L 29/45* (2013.01); *H01L 29/66545* (2013.01); *H01L 29/66636* (2013.01); *H01L 29/66795* (2013.01); *H01L 29/7851* (2013.01)

(58) Field of Classification Search
  CPC ......... H01L 21/823878; H01L 27/0924; H01L 29/0653; H01L 29/0847; H01L 29/41791; H01L 29/45; H01L 29/66545; H01L 29/66636; H01L 29/66795; H01L 29/7851; H01L 29/161; H01L 29/165; H01L 29/7848
  See application file for complete search history.

(56) References Cited

U.S. PATENT DOCUMENTS

| | | | |
|---|---|---|---|
| 11,322,590 B2 | 5/2022 | Jung et al. | |
| 2015/0069526 A1 | 3/2015 | Basker et al. | |
| 2016/0315172 A1* | 10/2016 | Wu | H01L 21/31111 |
| 2019/0067484 A1* | 2/2019 | Kim | H01L 29/6656 |
| 2019/0287859 A1 | 9/2019 | Huang | |
| 2021/0125984 A1* | 4/2021 | Holt | H01L 21/823864 |

* cited by examiner

ASYMMETRIC EPITAXY REGIONS FOR LANDING CONTACT PLUG

PRIORITY CLAIM AND CROSS-REFERENCE

This application claims the benefit of the U.S. Provisional Application No. 63/065,267, filed on Aug. 13, 2020, and entitled "Asymmetric EPI Profile for MD Landing," and U.S. Provisional Application No. 63/078,967, filed Sep. 16, 2020 and entitled "Asymmetric EPI Profile for MD Landing," which applications are hereby incorporated herein by reference.

BACKGROUND

In the formation of Fin Field-Effect Transistors, source/drain regions were typically formed by forming semiconductor fins, recessing semiconductor fins to form recesses, and growing epitaxy regions starting from the recesses. The epitaxy regions grown from the recesses of neighboring semiconductor fins may merge with each other, and the resulting epitaxy regions may have planar top surfaces. Source/drain contact plugs are formed to electrically connect to the source/drain regions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
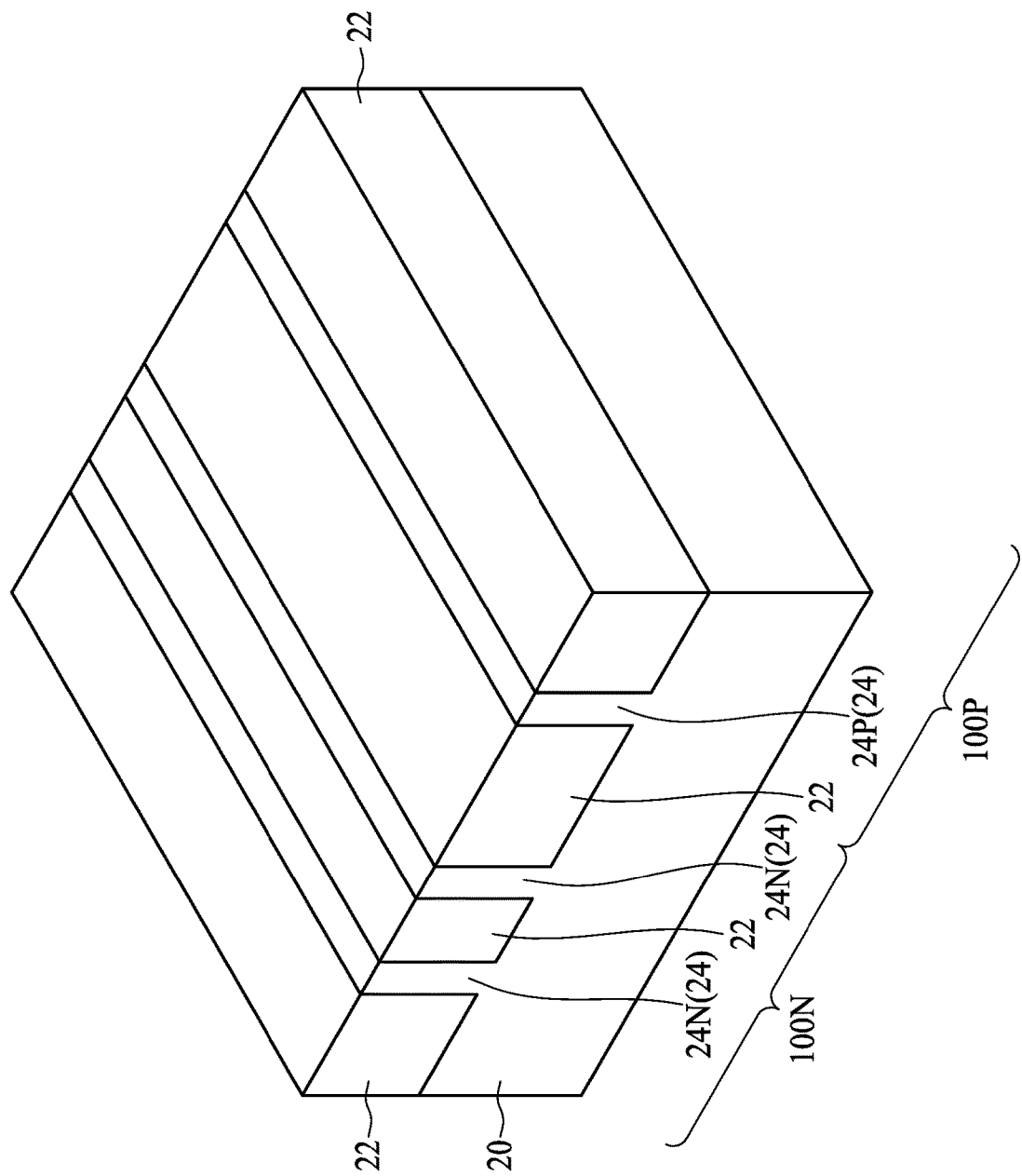
FIGS. 1, 2, 3A, 3B, 3C, 4A, 4B, 5-8, 9A, 9B, 10, 11A, and 11B illustrate the perspective views and cross-sectional views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and the method of forming the same are provided. In accordance with some embodiments of the present disclosure, a merged epitaxy region, which is a source/drain region of a FinFET, has an asymmetric profile, with the epitaxy regions grown from different fins have different heights, and the top surface of the merged epitaxy region being tilted. Accordingly, when a source/drain silicide region and a source/drain contact plug are formed to connect to the epitaxy region, the epitaxy region has both of its top surface and sidewall contacting the source/drain silicide region, and hence the contact resistance is reduced. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1, 2, 3A, 3B, 3C, 4A, 4B, 5-8, 9A, 9B, 10, 11A, and 11B illustrate the cross-sectional views of intermediate stages in the formation of FinFETs and the corresponding source/drain regions in accordance with some embodiments of the present disclosure. The corresponding processes are also reflected schematically in the process flow shown in FIG. 14.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. The top surface of substrate 20 may have a (100) surface plane. Substrate 20 may be doped with a p-type or an n-type impurity. Isolation regions 22 such as Shallow Trench Isolation (STI) regions may be formed to extend from a top surface of substrate 20 into substrate 20. The respective process is illustrated as process 202 in the process flow shown in FIG. 14. The portions of substrate 20 between neighboring STI regions 22 are referred to as semiconductor strips 24N and 24P, which are also individually and connectively referred to as semiconductor strips 24. The top surfaces of semiconductor strips 24N and 24P and the top surfaces of STI regions 22 may be substantially level with each other in accordance with some embodiments.

STI regions 22 may include a liner oxide (not shown), which may be a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed using Flowable Chemical Vapor Deposition (FCVD), spin-on, or the like.

Wafer 10 includes a first device region and a second device region neighboring each other. Each of the device regions is for forming a FinFET therein. The FinFET formed in each of the first device region and the second device region may be an n-type FinFET or a p-type FinFET. In an example embodiment, the first device region is for forming an n-type FinFET, and the second device region is for forming a p-type FinFET. Accordingly, the first device region and the second device region are referred to as device regions 100N and 100P, respectively. To distinguish the features in n-type device region 100N and p-type device region 100P from each other, the features formed in n-type device region 100N may be referred to with a reference number followed by letter "N," and the features formed in p-type device region 100P may be referred to with a reference number followed by letter "P." For example, the semiconductor strips 24 in n-type device region 100N are referred to as 24N, and the semiconductor strips 24 in p-type device region 100P are referred to as 24P. In accordance with some embodiments, semiconductor strips 24N are formed of or comprise silicon (without germanium), while semiconductor strips 24P are replaced with silicon germanium. In accordance with alternative embodiments, both of semiconductor strips 24N and 24P are formed of or comprise silicon without germanium.

Figure 2:
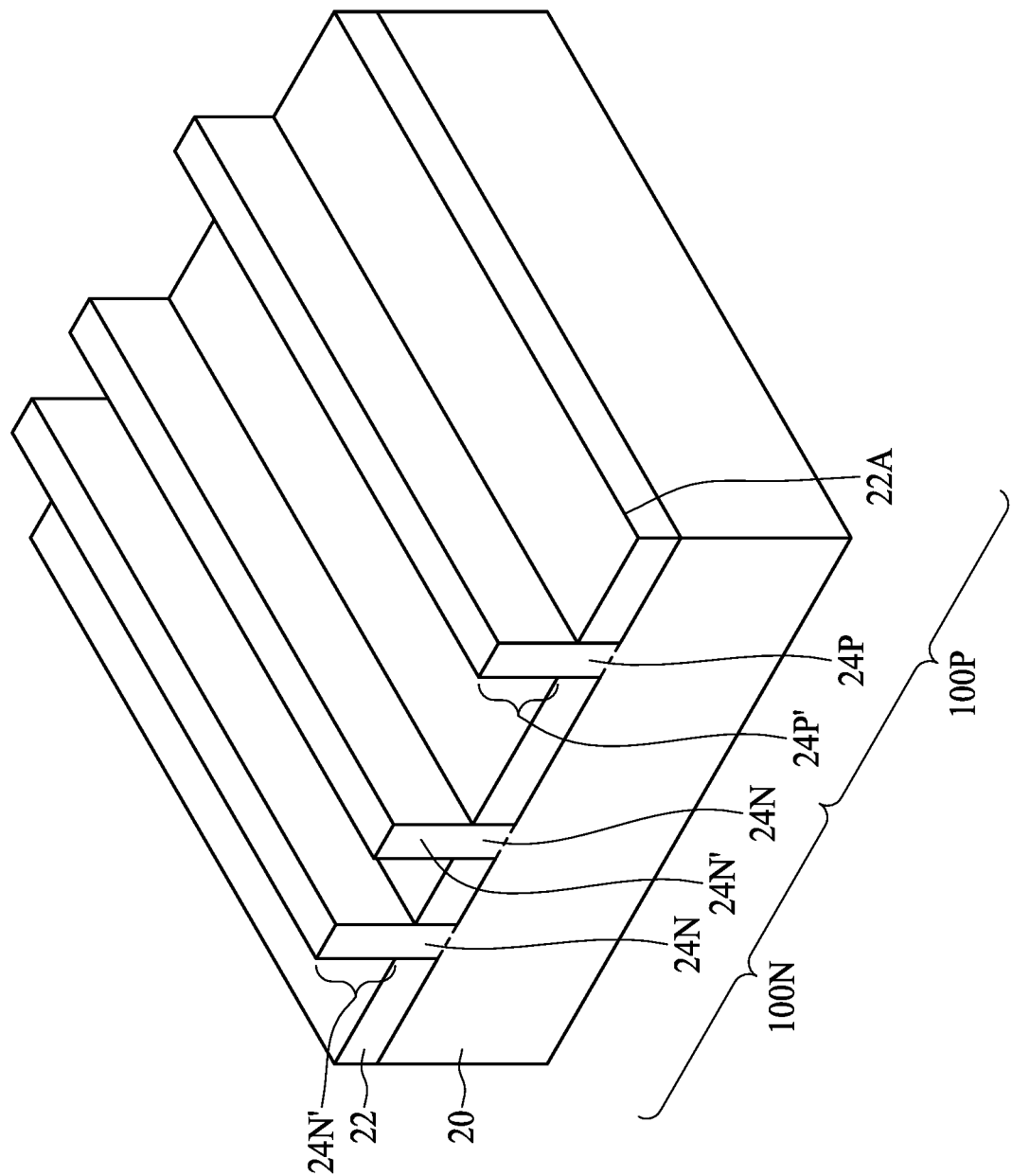

Referring to FIG. 2, STI regions 22 are recessed, so that the top portions of semiconductor strips 24N and 24P protrude higher than the top surfaces 22A of STI regions 22 to form protruding fins 24N' and 24P', respectively. The respective process is illustrated as process 204 in the process flow shown in FIG. 14. The portions of semiconductor strips 24N and 24P in STI regions 22 are still referred to as semiconductor strips. The etching may be performed using a dry etching process, wherein a mixture of HF and $NH_3$ may be used as the etching gases. The etching may also be performed using a mixture of $NF_3$ and $NH_3$ as the etching gases. During the etching process, plasma may be generated. Argon may also be included. In accordance with alternative embodiments of the present disclosure, the recessing of STI regions 22 is performed using a wet etching process. The etching chemical may include HF solution, for example.

In accordance with some embodiments, the fins for forming the FinFETs may be formed/patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 3A:
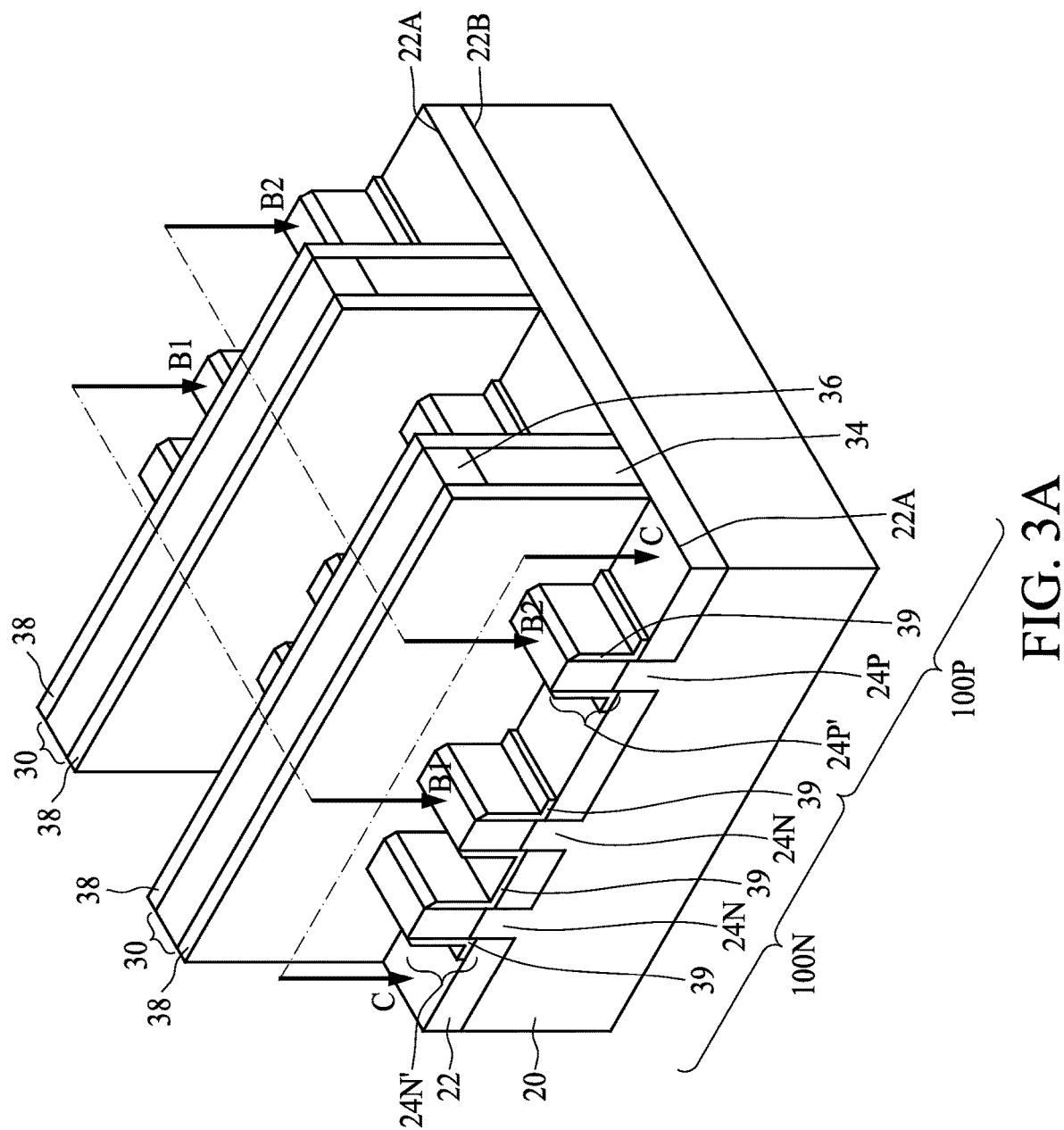
Figure 3B:
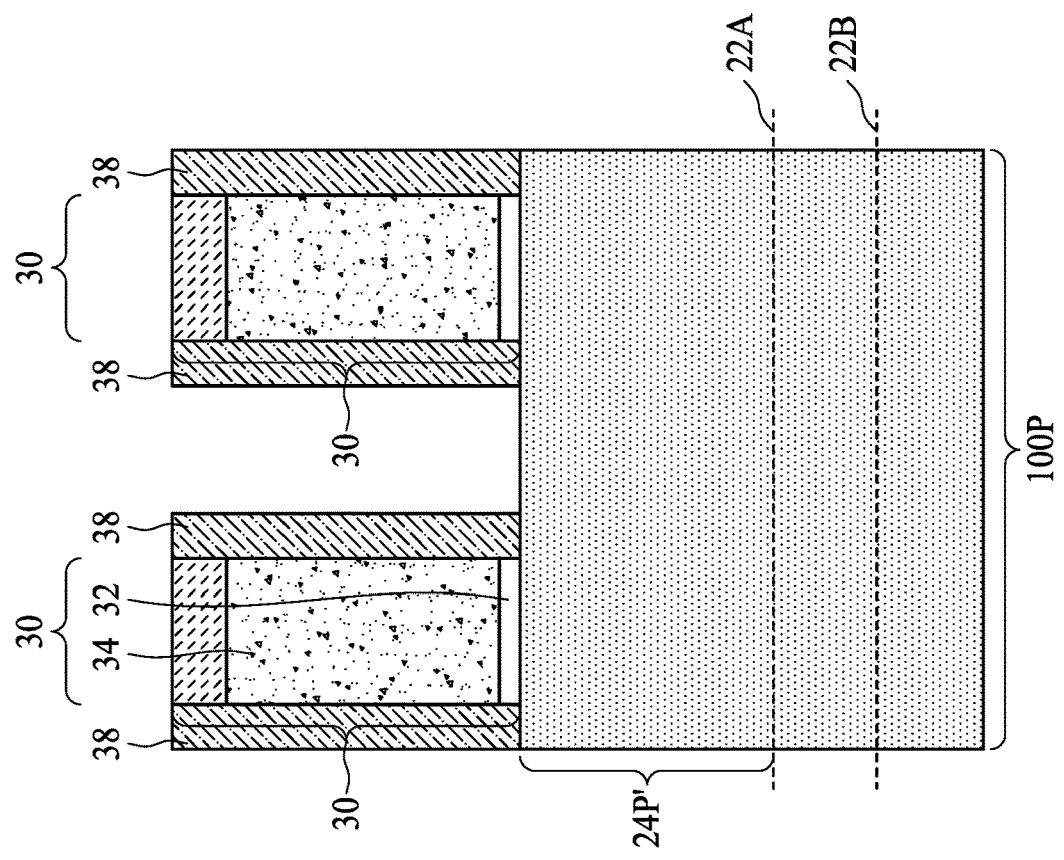
Figure 3B:
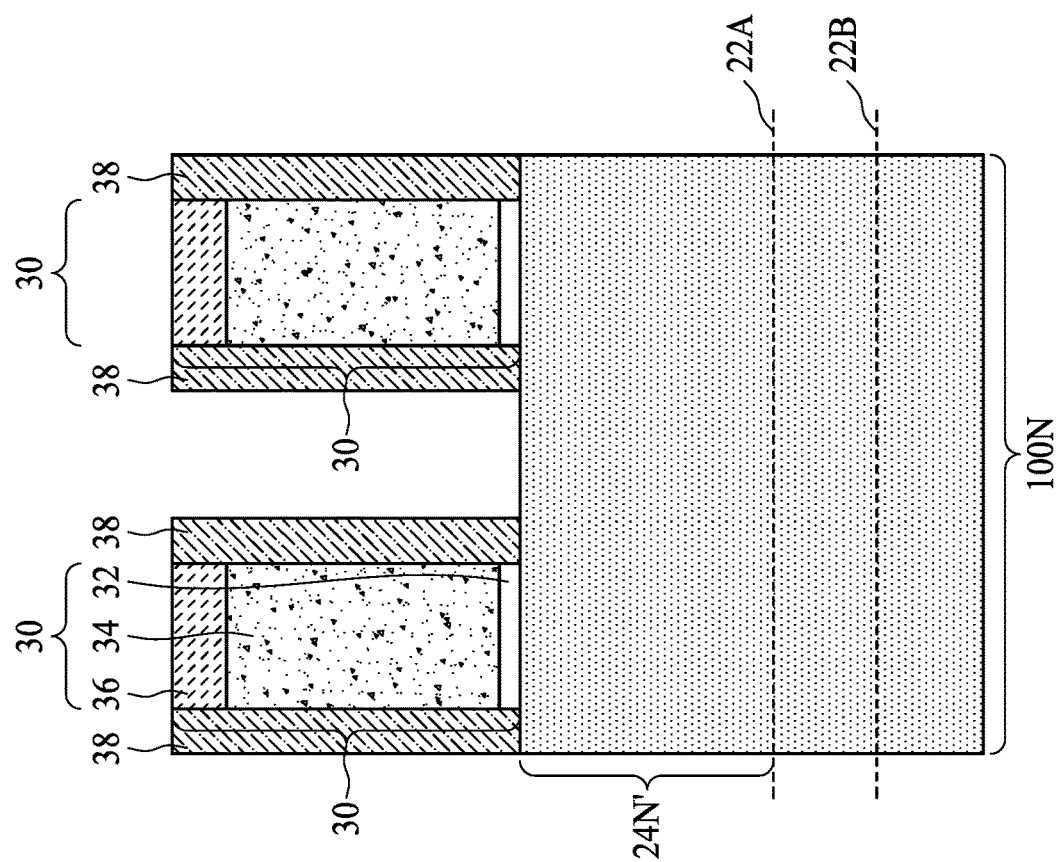
Figure 3C:
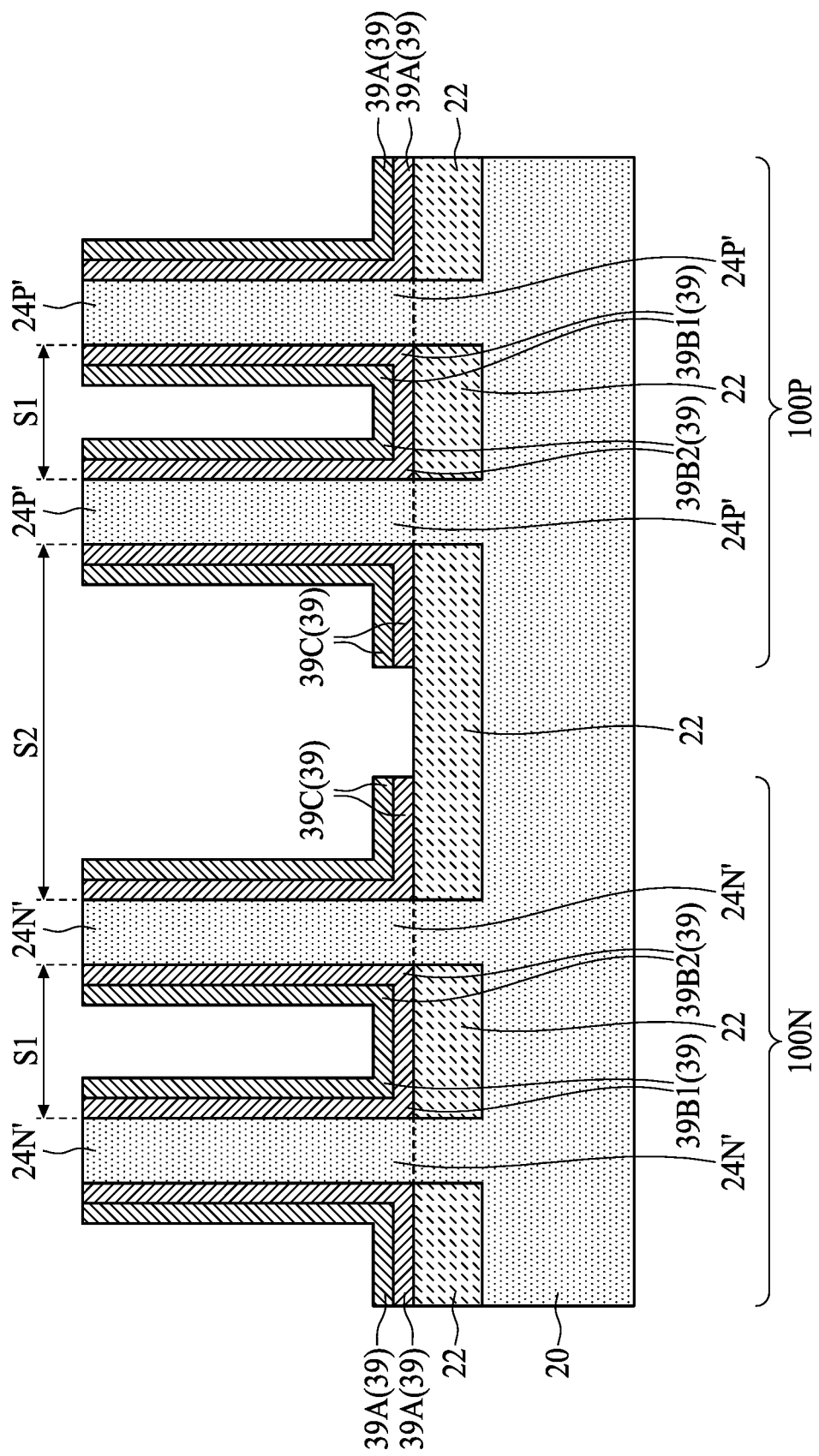

Referring to FIGS. 3A, 3B, and 3C, dummy gate stacks 30 are formed on the top surfaces and the sidewalls of protruding fins 24N' and 24P'. The respective process is illustrated as process 206 in the process flow shown in FIG. 14. The cross-sections shown in FIG. 3B are obtained from the reference cross-sections B1-B1 and B2-B2 in FIG. 3A. In FIG. 3B and subsequent FIG. 11B, the level of the top surfaces 22A of STI regions 22 (also refer to FIG. 3A) may be illustrated, and semiconductor fin 24' is higher than top surfaces 22A. Bottom surfaces 22B (also refer to FIG. 3A) of STI regions 22 are also illustrated in the cross-sectional views. STI regions 22 are locate at the level between 22A and 22B, and are not shown in FIGS. 3B and 11B since they are in different planes than illustrated.

The cross-section shown in FIG. 3C is obtained from the reference cross-section C-C in FIG. 3A, except FIG. 3A illustrates a portion of the device region 100P. In accordance with some embodiments, protruding fins 24N' may be closely located from each other to form a fin-group. Protruding fins 24P' may also be closely located from each other to form a fin-group. The inner-group spacings S1 (FIG. 3C) between the fins in the same fin-group are smaller than the inter-group spacings S2 between neighboring fin-groups. In accordance with some embodiments, both of the fin-groups are multi-fin fin-groups, as shown in FIG. 3C. In accordance with alternative embodiments, one of the fin-groups is a single-fin-group. For example, the rightmost fin in FIG. 3C may not be formed, and hence there is a 2-fin fin-group on the left, and a single-fin fin-group on the right. Each of the fin-groups may also include more than two fins in accordance with some embodiments.

Dummy gate stacks 30 may include dummy gate dielectrics 32 (FIG. 3B) and dummy gate electrodes 34 over dummy gate dielectrics 32. Dummy gate electrodes 34 may be formed using, for example, amorphous silicon or polysilicon, and other materials may also be used. Each of dummy gate stacks 30 may also include one (or a plurality of) hard mask layer 36 over dummy gate electrode 34. Hard mask layers 36 may be formed of silicon nitride, silicon carbo-nitride, or the like. Dummy gate stacks 30 also have lengthwise directions perpendicular to the lengthwise directions of protruding fins 24'.

Next, gate spacers 38 (FIGS. 3A and 3C) are formed on the sidewalls of dummy gate stacks 30. The respective process is also illustrated as process 206 in the process flow shown in FIG. 14. In accordance with some embodiments of the present disclosure, gate spacers 38 are formed of dielectric materials such as silicon carbon-oxynitride (SiCN), silicon nitride, silicon oxy-carbon-oxynitride (SiOCN), or the like, and may have a single-layer structure or a multi-layer structure including a plurality of dielectric layers. The formation processes include depositing conformal spacer layers, and then performing anisotropic etching processes to form the gate spacers 38 (and fin spacers 39). In accordance with some embodiments of the present disclosure, gate spacers 38 are multi-layer gate spacers. For example, each of gate spacers 38 may include a SiN layer, and a SiOCN layer over the SiN layer. FIGS. 3A and 3C also illustrate fin spacers 39 formed on the sidewalls of protruding fins 24'. The respective process is also illustrated as process 206 in the process flow shown in FIG. 14.

In accordance with some embodiments of the present disclosure, fin spacers 39 (including 39A, 39B, and 39C) are formed by the same processes for forming gate spacers 38. For example, in the process for forming gate spacers 38, the blanket dielectric layer(s) that are deposited for forming gate spacers 38, when etched, may have some portions left on the sidewalls of protruding fins 24N' and 24P', hence forming fin spacers 39.

Figure 4A:
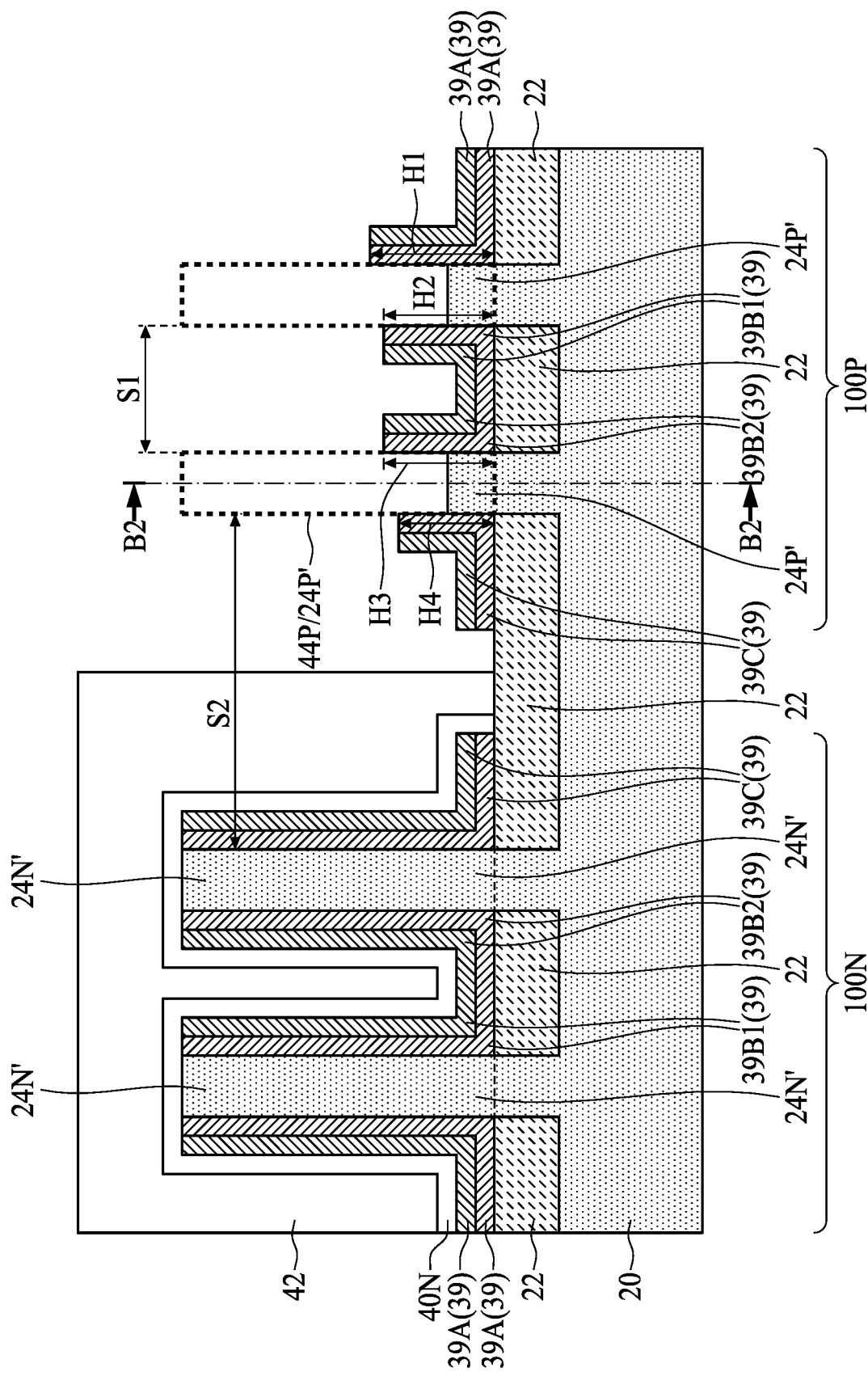
Figure 4B:
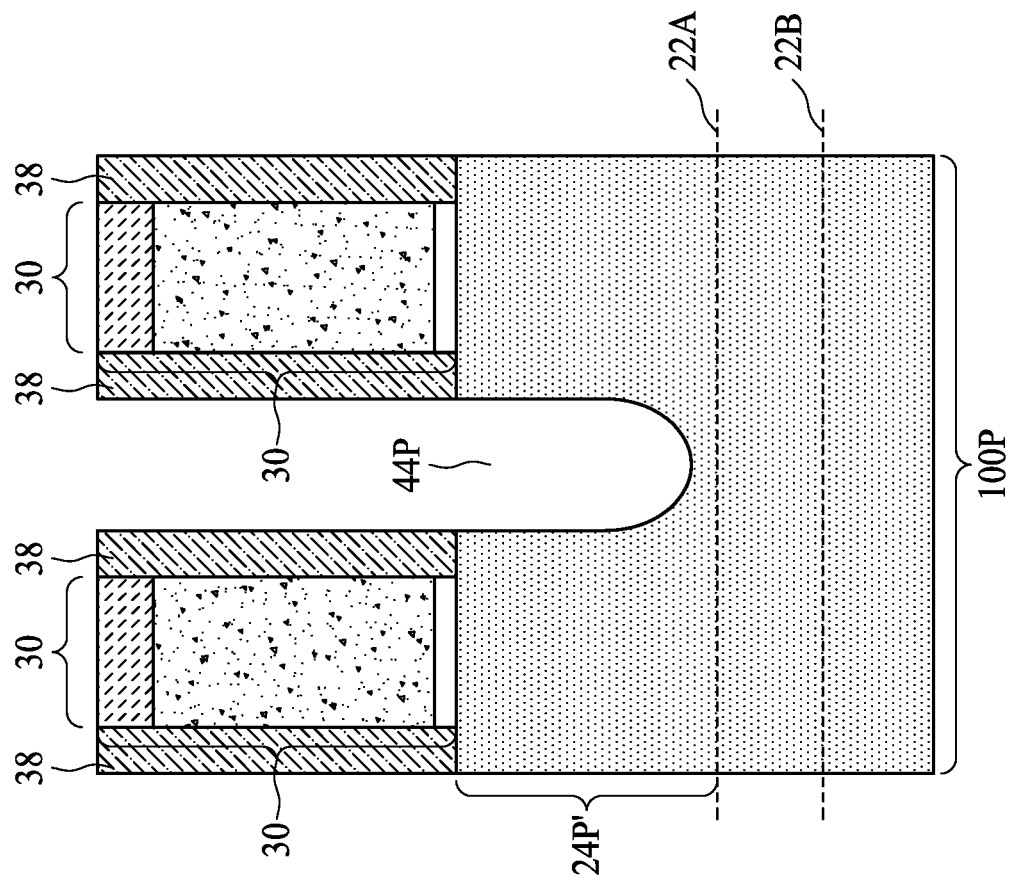
Figure 14:
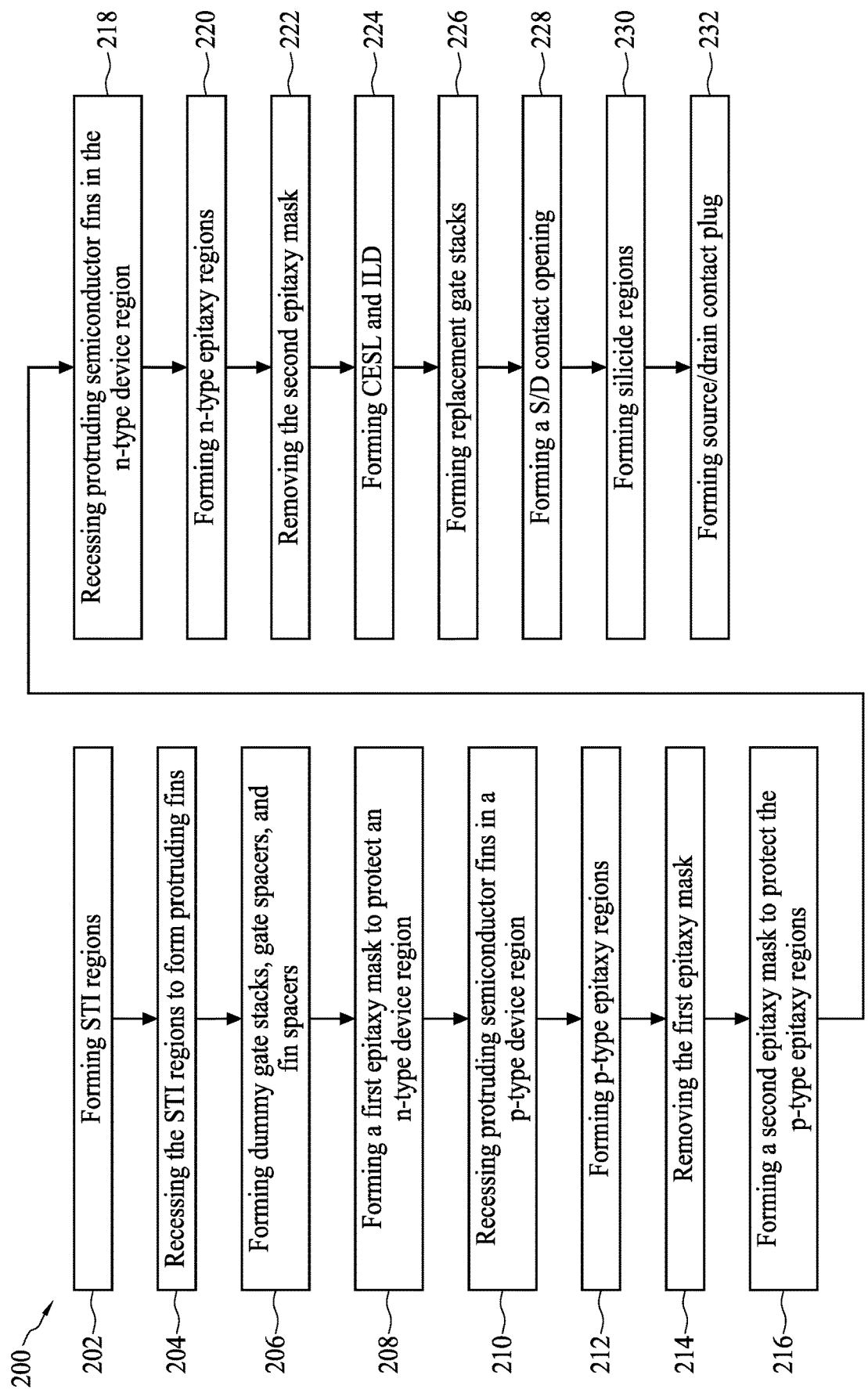
FIG. 14 illustrates a process flow for forming an n-type FinFET and a p-type FinFET in accordance with some embodiments.

Referring to FIGS. 4A and 4B, a first epitaxy mask 40N is formed. FIG. 4B illustrates the reference cross-section B2-B2 in FIG. 4A. The respective process is illustrated as process 208 in the process flow 200 as shown in FIG. 14. In accordance with some embodiments, epitaxy mask 40N is formed of a dielectric material, which may be formed of or comprise SiON, SiOCN, AlO, SiN, SiOC, $SiO_2$, or the like.

The material of epitaxy mask 40N is also different from the material of fin spacers 39 and STI regions 22. In accordance with some embodiments of the present disclosure, epitaxy mask 40N is deposited using a conformal deposition process such as Atomic Layer deposition (ALD), Chemical Vapor Deposition (CVD), or the like. In accordance with some embodiments, etching mask 42N is formed, which may be formed of or comprises a photo resist. Other layers such as Bottom Anti-Reflective Coating (BARC) may be, or may not be formed as parts of the etching mask 42N. Etching mask 42N is patterned to cover n-type FinFET region 100N, and leaving p-type FinFET region 100P exposed. An etching process is then performed to remove the portion of epitaxy mask 40N in p-type FinFET region 100P, while the portion of epitaxy mask 40N in n-type FinFET region 100N is not removed. The etching process is an isotropic process, which may be a dry etching process or a wet etching process.

Next, protruding fins 24P' are recessed through etching, and hence forming recesses 44P. The respective process is illustrated as process 210 in the process flow 200 as shown in FIG. 14. Etching mask 42N is also removed, and may be removed before or after the etching of protruding fins 24P'. In accordance with some embodiments, the etching of protruding fins 24P' is performed until recesses 44P extend to a level lower than the top ends of fin spacers 39 (FIG. 4A), and higher than the top surfaces of STI regions 22. As shown in FIG. 4A, dashed lines are shown to represent the etched portions of protruding fins 24P'. The dashed lines also show the top surfaces and the sidewalls of the portions of protruding fins 24P' that are directly under dummy gate stack 30 (refer to FIG. 3B).

In accordance with some embodiments of the present disclosure, the recessing of protruding fins 24' is performed through a dry etching step. The dry etching may be performed using process gases such as $C_2F_6$, $CF_4$, $SO_2$, the mixture of HBr, $Cl_2$, and $O_2$, the mixture of HBr, $Cl_2$, $O_2$, and $CF_2$ etc., or the like. The etching may be anisotropic. In accordance with some embodiments of the present disclosure, as shown in FIG. 4B, the sidewalls of protruding fins 24' facing recess 44P are substantially vertical, and are substantially flushed with the outer sidewalls of gate spacers 38. The sidewalls of protruding fins 24' facing recess 44P may be on (110) surface planes of protruding fins 24P'.

In accordance with some embodiments, during the etching of protruding fins 24', fin spacers 39 are also etched, and their heights reduced. The etching of fin spacers 39 may be performed at the same time fins 24' are recessed, with an etching gas(es) for etching fin spacers 39 added into the etching gas for recessing protruding fins 24'. In accordance with some embodiments, the fin spacers 39 include outer fin spacers such as fin spacers 39A and 39C (FIG. 4A), which are on the outer sides of the outmost fin in the fin-group. The fin spacers 39 further include inner fin spacers such as fin spacer 39B1 and 39B2, with the inner fin spacers being between the fins in the same fin-group. Throughout the description, outer fin spacers 39 include the fin spacer 39C facing toward the neighboring fin-group, and fin spacer 39A facing away from the neighboring fin-group.

In accordance with some embodiments, the process conditions for etching fin spacers 39 are adjusted so that the height H1 of outer spacer 39A is higher than the heights H2 and H3 of inner spacers 39B1 and 39B2, which are connected to each other due to the small inner-fin spacing. Furthermore, the process for etching the fin spacers are adjusted so that the heights H2 and H3 of inner spacers 39B1 and 39B2 are greater than height H4 of outer spacer 39C, so that relationship (H1>H2 & H3>H4) is achieved. Height H2 may be greater than, equal to, or smaller than, height H3. The ratios of heights H1, H2, H3, and H4 may also be in desirable ranges. In accordance with some embodiments, ratios H1/H2 and H1/H3 may be greater than about 1.05, and may be in the range between about 10 nm and about 30 nm. Ratios H2/H4 and H3/H4 may be greater than about 1.2, and may be in the range between about 5 nm and about 20 nm.

The etching of the fin spacers may be performed using a fluorine-containing gas such as the mixture of $CF_4$, $O_2$, and $N_2$, the mixture of $NF_3$ and $O_2$, $SF_6$, the mixture of $SF_6$ and $O_2$, or the like, and may include a gas for bombarding outer spacers 39A such as argon. The adjusted process conditions include, and are not limited to, partial pressures of etching gases and the bombarding gases, the bias voltage, and/or the like. Furthermore, loading effect may be used to help to achieve the desirable heights of fins spacers. For example, the ratio S2/S1, which is the ratio of inter-group spacing S2 to inner-group spacing S1, may be adjusted to adjust the loading effect, so that heights H1, H2, H3, and H4 may be adjusted.

In accordance with some embodiments, after the etching of protruding fins 24P', an additional etching process is performed to further etch fin spacers 39, and to adjust the heights of protruding fins 39. In accordance with alternative embodiments, the etching is skipped. The etching process (if performed) may also be performed using an anisotropic etching process using, for example, similar process gases as in the formation of fin spacers. In accordance with some embodiments, the formation of fin spacers 39 may not be able to achieve the relationship (H1>H2 & H3>H4). For example, in the preceding formation of fin spacers 39, heights H2 and H3 may be adversely smaller than height H4. The etching process is thus performed to adjust the fin spacer heights. Alternatively, the relationship (H1>H2 & H3>H4) may have already been achieved by the preceding formation of fin spacers 39, but the ratios between fin spacer heights H1, H2, H3, and H4 are not satisfactory. Accordingly, the additional etching process may be performed to adjust the ratios to desirable values.

Figure 5:
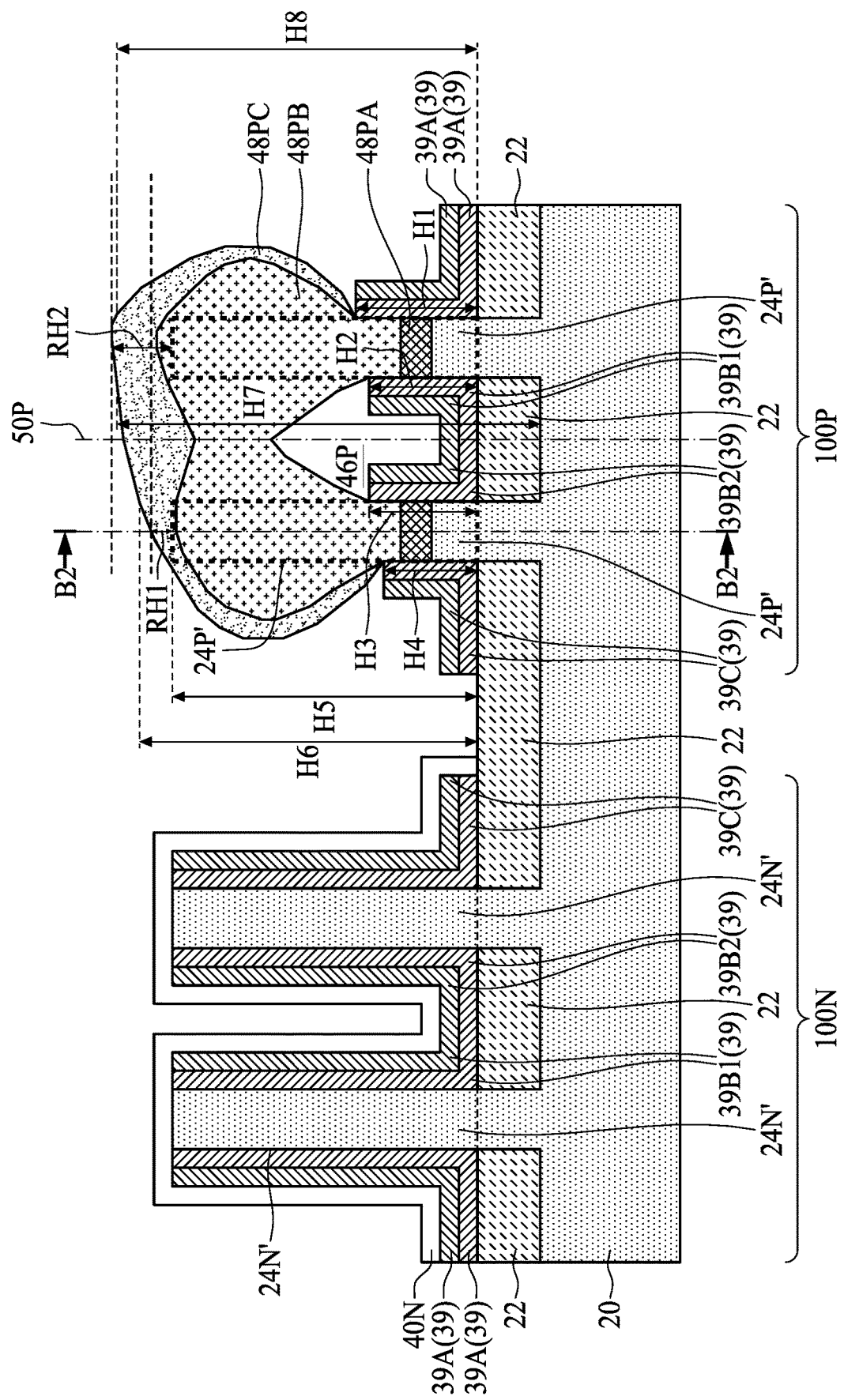

FIG. 5 illustrates the formation of epitaxy region(s)48P, which may include epitaxy layers 48PA, 48PB, and 48PC in accordance with some embodiments. The respective process is illustrated as process 212 in the process flow 200 as shown in FIG. 14. Epitaxy layers 48PA, 48PB, and 48PC are formed through selective epitaxy processes. The deposition of epitaxy layers 48PA, 48PB, and 48PC may be performed using RPCVD, PECVD, or the like. In accordance with some embodiments, the deposition of epitaxy layers 48PA is performed through a non-conformal deposition process, so that the bottom portion of epitaxy layer 48PA is thicker than the sidewall portions. In accordance with some embodiments, epitaxy layers 48PA, 48PB, and 48PC are formed of or comprise SiGeB. The process gas may include a silicon-containing gas such as silane, disilane ($Si_2H_6$) dicholorosilane (DCS), or the like, a germanium-containing gas such as germane ($GeH_4$), digermane ($Ge_2H_6$), or the like, and a dopant-containing process gas such as $B_2H_6$ or the like. Epitaxy layer 48PA may have a boron concentration in the range between about $1\times10^{20}/cm^3$ and about $6\times10^{20}/cm^3$. The germanium atomic percentage may be in the range between about 15 percent and about 40 percent, and may be gradient, with the upper portions having higher germanium atomic percentages than the respective lower portions.

Epitaxy layer 48PB may have a boron concentration higher than the boron concentration in epitaxy layer 48PA. For example, the boron concentration in epitaxy layer 48PB may be in the range between about $6\times10^{20}/cm^3$ and about $3 \times 10^{21}/cm^3$ in accordance with some embodiments. Furthermore, the germanium atomic percentage in epitaxy layer 48PB is higher than the germanium atomic percentage in epitaxy layers 48PA. For example, the germanium atomic percentage in epitaxy layer 48PB may be in the range between about 40 percent and about 60 percent in accordance with some embodiments.

The top ends of epitaxy layer 48PB are close to the top end of protruding fins 24P'. FIG. 11B illustrates the cross-sectional views of the reference cross-sections B2-B2 in FIG. 5, which shows that the opposite ends of epitaxy layer 48PB are level with the top surfaces of protruding fins 24P', while the middle portion of the top surface of epitaxy layer 48PB may be lower, level with, or slightly higher than the top surfaces of protruding fins 24P'. As shown in FIG. 5, the epitaxy layer 48PB grown from neighboring recesses are merged, with air gap 46P being sealed under epitaxy layer 48PB. The top surface of the merged epitaxy layer 48PB may have a non-planar profile (also referred to as having a wavy (concave) shape), with the middle portion between neighboring fins 24P' (and the corresponding recesses 44P) being lower than the portions on its opposite sides. Furthermore, the left portions of epitaxy layer 48PB, which are closer to protruding fins 24N' are shorter than the right portions of epitaxy layer 48PB.

The top surface of epitaxy layer 48PC may have a non-wavy (convex) shape. Furthermore, a right portion of the top surface is the highest, and the left portions are lower. In accordance with some embodiments, epitaxy layer 48PC includes silicon SiGeB. In accordance with some embodiments, the boron concentration in epitaxy layer 48PC may be in the range between about $8 \times 10^{20}/cm^3$ and about $1 \times 10^{21}/cm^3$. Furthermore, the germanium atomic percentage in epitaxy layer 48PC is lower than the germanium atomic percentage in epitaxy layers 48PB. For example, the germanium atomic percentage in epitaxy layers 48PC may be in the range between about 45 percent and about 55 percent in accordance with some embodiments. Throughout the description, epitaxy layers 48PA, 48PB, and 48PC are collectively and individually referred to as epitaxy layers (regions) 48P, which are also collectively referred to as source/drain region 48P hereinafter.

The deposition process for forming each of epitaxy layers 48PA, 48PB, and 48PC may include an etching back process after the deposition. The etching back may be performed with an etching gas (such as HCl), and may or may not include a silicon-containing gas such as $SiH_4$. The etching back results in and improves the formation of (111) facets.

Throughout the description, the protruding fins 24P' and 24N' (the second and third protruding fin from left) in a fin-group and closest to its neighboring fin-group 24N' is referred to as an inner fin, and the protruding fins 24P' and 24N' (the first and the fourth protruding fin from left) in a fin-group and farthest from the neighboring fin-group 24N' is referred to as an outer fin. Similarly, the portions of epitaxy regions grown based on the inner fins are referred to as inner portions, and the portions of epitaxy regions grown based on the outer fins are referred to as outer portions. Since the fin spacers have heights with the relationship (H1>H2 & H3>H4), epitaxy layers 48PB and 48PC have an asymmetric profile, with the inner portions of epitaxy layers 48PB and 48PC being shorter than the outer portions of epitaxy layers 48PB and 48PC. For example, the top end of the inner portion of epitaxy layer 48PB has raised height RH1, which is lower than raised height RH2 of the top end of the outer portion of epitaxy layer 48PB. The raised heights are the heights of epitaxy region 48P above the respective protruding fins 24P'. The height difference (RH2−RH1) may be greater than about 2 nm, and may be in the range between about 2 nm and about 15 nm. Furthermore, height H5 may be smaller than height H6, and height H7 may be smaller than H8, which means from the outer portion to the inner portions, the heights of the epitaxy regions reduce as a general trend. Overall, if using middle line 50P between inner fin 24P' and outer fin 24P' as a reference, the inner-side portions of epitaxy region 48P are shorter than the respective outer-side portions. Furthermore, the top surface of epitaxy region 48P is tilted toward it neighboring fin group, which is caused by the adjusted heights H1, H2, H3, and H4 of fin spacers 39.

Figure 6:
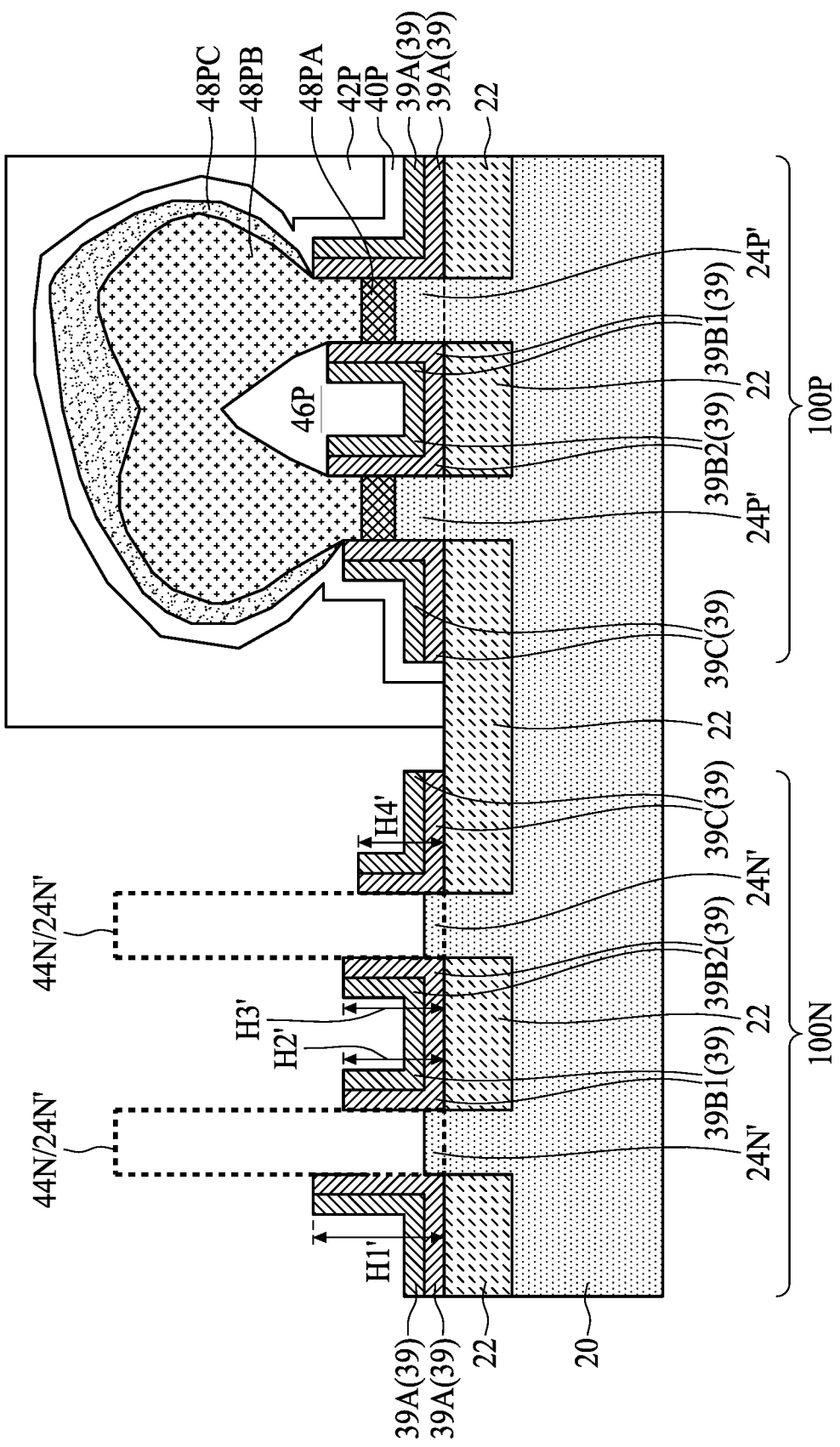

After the formation of epitaxy region(s) 48P, epitaxy mask 40N is removed. The respective process is illustrated as process 214 in the process flow 200 as shown in FIG. 14. Next, as shown in FIG. 6, epitaxy mask 40P is formed to protect epitaxy regions 48P, while leaving n-type device region 100N open. The respective process is illustrated as process 216 in the process flow 200 as shown in FIG. 14. Etching mask 42P may be formed for patterning epitaxy mask 40P, and is removed after epitaxy mask 40P is patterned. Protruding fins 24N' are recessed to form recesses 44N. The respective process is illustrated as process 218 in the process flow 200 as shown in FIG. 14. In accordance with some embodiments, the top surfaces of the remaining protruding fins 24N' are lower than the top ends of fin spacers 39. Fin spacers 39 are also recessed during the etching of protruding fins 24N' to achieve relationship (H1'>H2' & H3' >H4'). In accordance with some embodiments, after the recessing of protruding fins 24N', an additional etching process is used to further etch fin spacers 39, and to adjust the heights of fin spacers 39, so that the relationship (H1'>H2' & H3'>H4') is achieved, and the ratios between fin spacer heights H1', H2', H3', and H4' are adjusted to obtain the desirable ratios. In the additional etching process, protruding fins 24N' are not recessed. In accordance with alternative embodiments, the additional etching process is skipped.

Figure 7:
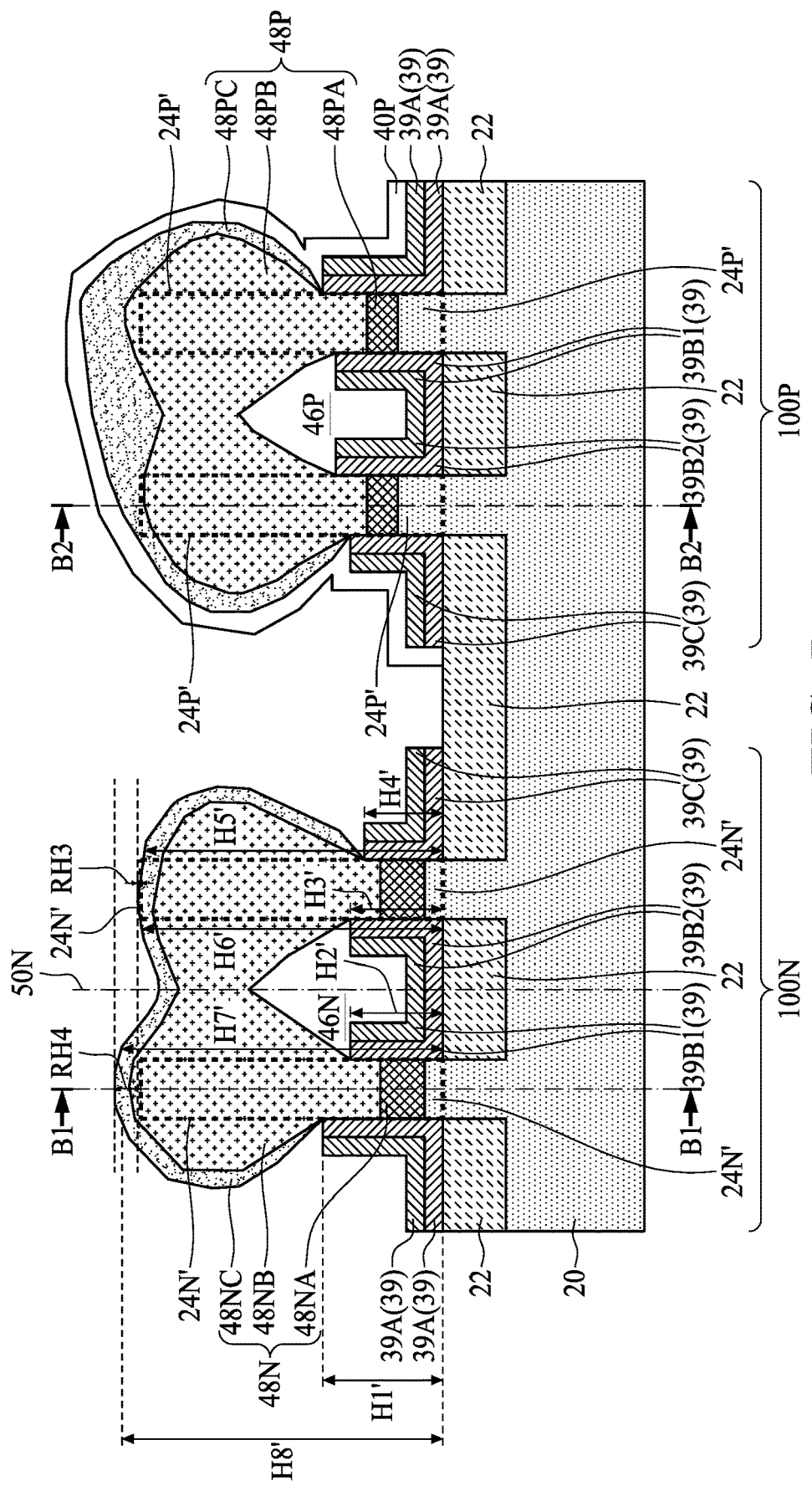

FIG. 7 illustrates the selective epitaxy process for forming epitaxy layers 48NA, 48NB, and 48NC in n-type FinFET region 100N. The respective process is illustrated as process 220 in the process flow shown in FIG. 14. The cross-sectional view shape of epitaxy layers 48NA, 48NB, and 48NC in reference cross-section B1-B1 may also be found in FIG. 11B. In accordance with some embodiments, the deposition of epitaxy layers 48NA, 48NB, and 48NC may be performed using RPCVD, PECVD, or the like. In the discussion of epitaxy layers 48NA, 48NB, and 48NC (FIGS. 11A and 11B), phosphorous is used as an example n-type dopant, while other n-type dopants such as arsenic, antimony, or the like, or combinations thereof, may also be used. Also, in the above-discussion of epitaxy layers 48PA, 48PB, and 48PC (FIGS. 11A and 11B), boron is discussed as an example of the p-type dopants, while other p-type dopant such as indium may be used.

In accordance with some embodiments, epitaxy layer 48NA is formed of or comprises silicon phosphorous (SiP). Epitaxy layer 48NA may have a doping concentration (such as P or As) in the range between about $1 \times 10^{20}/cm^3$ and about $8 \times 10^{20}/cm^3$. In the deposition process, an etching gas such as HCl is added into the process gases to achieve selective deposition on semiconductor, but not on dielectric. Carrier gas(es) such as $H_2$ and/or $N_2$ may also be included in the process gas, for example, with a flow rate in the range between about 500 sccm and about 5,000 sccm.

In accordance with some embodiments, epitaxy layer 48NB includes SiP, with the phosphorous having a second phosphorous concentration higher than the phosphorous concentration in epitaxy layer 48NA. For example, the phosphorous concentration in epitaxy layer 48NB may be in the range between about $8 \times 10^{20}/cm^3$ and about $5 \times 10^{21}/cm^3$ in accordance with some embodiments. The process gas for forming epitaxy layer 48NB may be similar to the process gas in the formation of epitaxy layer 48NA.

As shown in FIG. 7, the top ends of epitaxy layer 48NB are close to, and may be higher than, level with, or lower than the top ends of protruding fins 24N'. The epitaxy layer 48NB grown from neighboring recesses are merged, with air gap 46N being sealed under epitaxy layer 48NB. The top surface of the merged epitaxy layer 48NB may have a non-planar profile (also referred to as having a wavy shape), with the middle portion between neighboring semiconductor fins 24N' being lower than the portions on its opposite sides.

In accordance with some embodiments, epitaxy layer 48NC includes silicon phosphorous. In addition, germanium may be incorporated, for example, with a germanium atomic percentage in the range between about 1 percent and about 5 percent. In accordance with some embodiments, the phosphorous concentration in epitaxy layers 48NC may be in the range between about $1 \times 10^{21}/cm^3$ and about $3 \times 10^{21}/cm^3$. The process gas for forming epitaxy layer 48NC may be similar to the process gas in the formation of epitaxy layer 48NB, except a germanium-containing gas such as germane, digermane, or the like may be added. Throughout the description, epitaxy layers 48NA, 48NB, and 48NC are collectively and individually referred to as epitaxy layers or epitaxy regions 48N, which are also collectively referred to as source/drain regions 48N hereinafter.

The deposition process for forming each of epitaxy layers 48NA, 48NB, and 48NC may include an etching back process after the deposition. The etching back may be performed with an etching gas (such as HCl), and may or may not include a silicon-containing gas such as $SiH_4$. The etching back results in and improves the formation of (111) facets. Furthermore, epitaxy layers 48NA, 48NB, and 48NC may have (110) facets formed.

Since the fin spacers 39 have heights with the relationship (H1'>H2' & H3'>H4'), epitaxy layers 48NB and 48NC have an asymmetric profile, with the inner portions of epitaxy layers 48NB and 48NC grown from the recess of inner fins being shorter than the outer portions of epitaxy layers 48NB and 48NC grown from the recess of outer fins. For example, the top end of the inner portion of epitaxy layer 48NC has raised height RH3, which is lower than raised height RH4 of the top end of the outer portion of epitaxy layer 48NC. The height difference (RH4−RH3) may be greater than about 2 nm, and may be in the range between about 2 nm and about 10 nm. Furthermore, height H5' may be smaller than height H6', and height H7' may be smaller than H8', which means from the outer portion to the inner portions of a source/drain region 48N, the heights reduce as a general trend. Overall, if using middle line 50N as a reference, the inner-side portions of epitaxy region 48N are lower than the respective outer-side portions.

Figure 8:
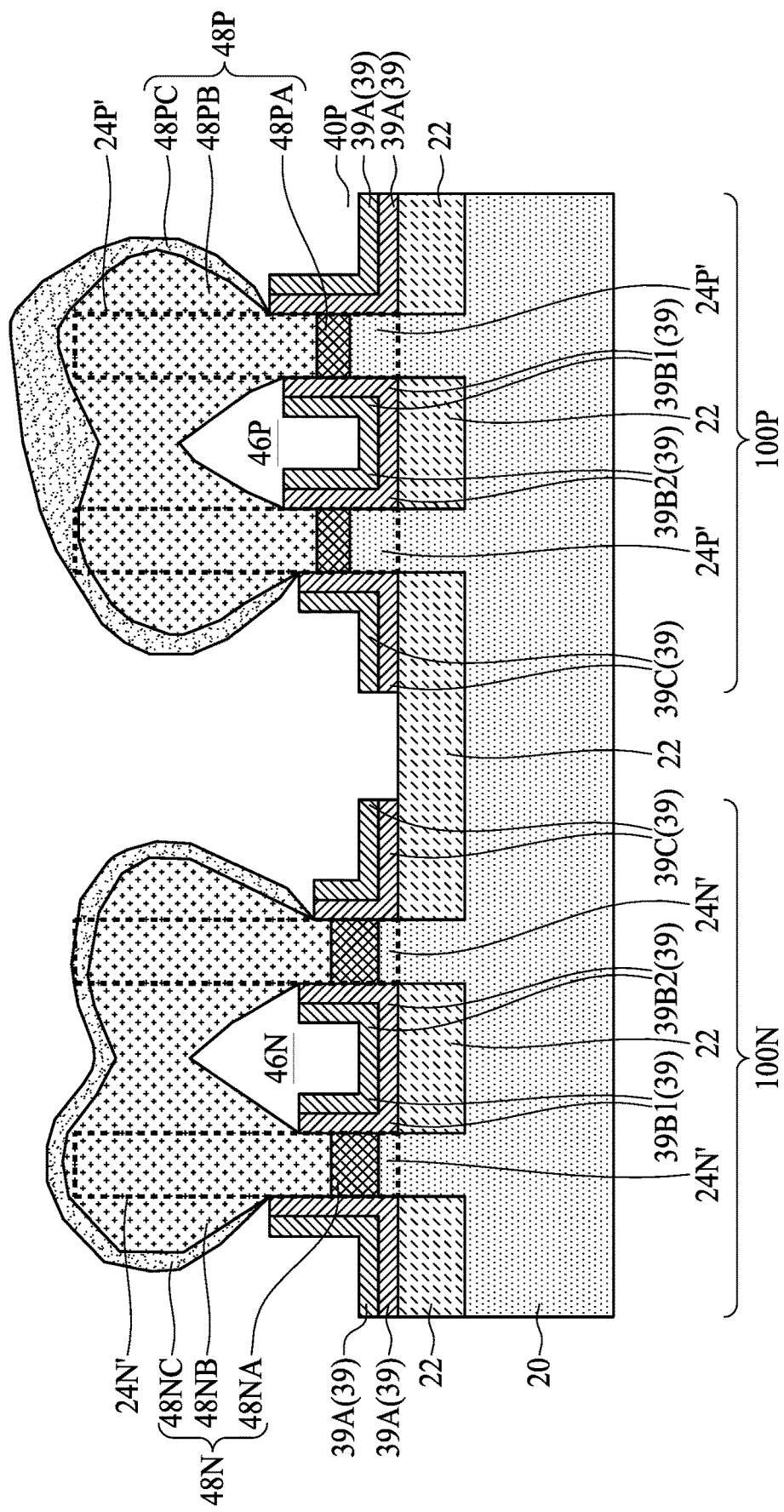

After the formation of epitaxy regions 48N, epitaxy mask 40P is removed, and the resulting structure is shown in FIG. 8. The respective process is illustrated as process 222 in the process flow 200 as shown in FIG. 14. Next, referring to FIG. 9A, Contact etch stop layer (CESL) 52 and Inter-Layer Dielectric (ILD) 54 are formed over epitaxy regions 48P and 48N, and over dummy gate stacks 30 (FIGS. 3A and 4B). The respective process is illustrated as process 224 in the process flow 200 as shown in FIG. 14. A planarization such as a Chemical Mechanical Polish (CMP) process or a mechanical grinding process is performed to remove excess portions of CESL 52 and ILD 54, until dummy gate stacks 30 (FIG. 8B) are exposed.

Figure 9A:
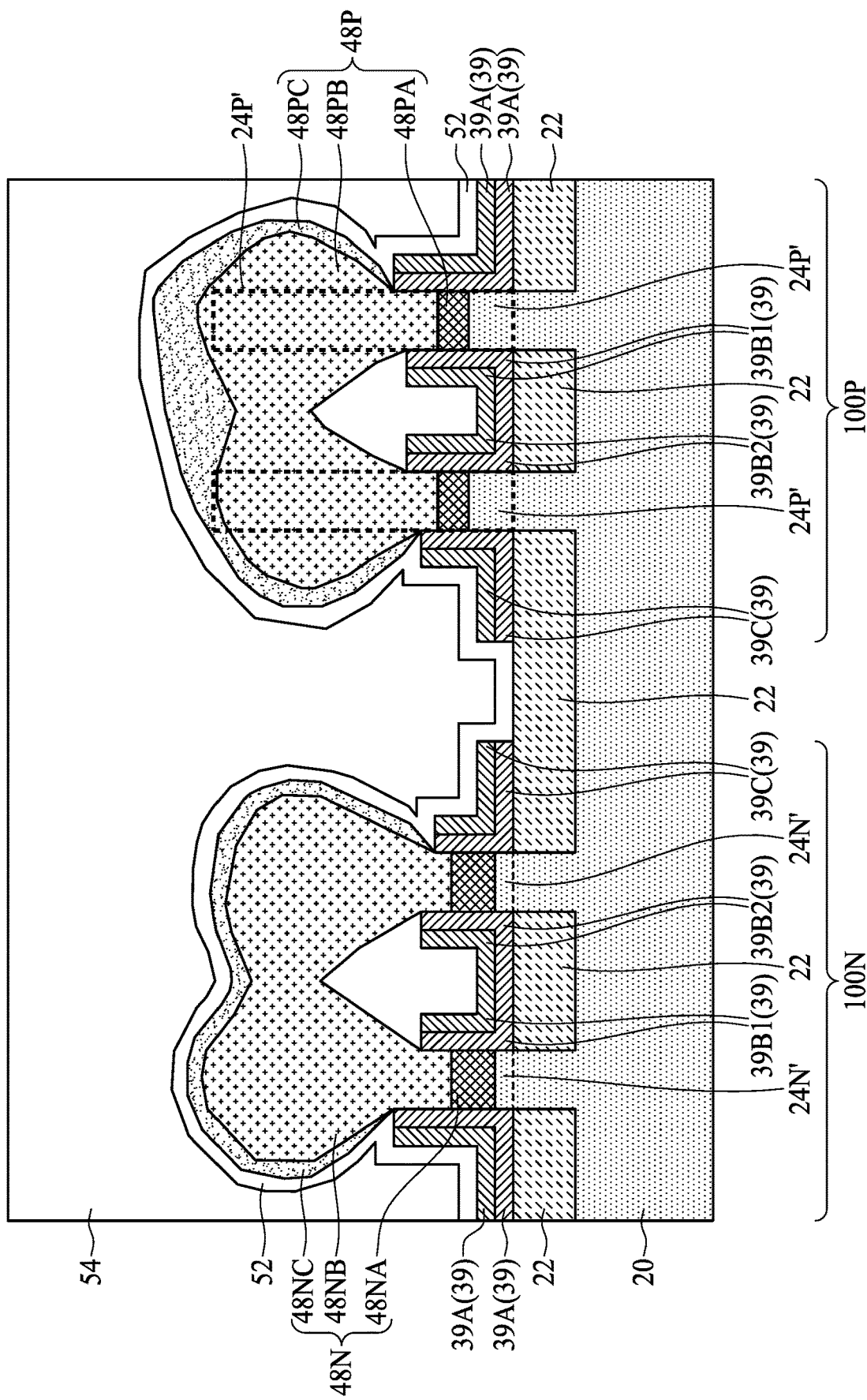
Figure 9B:
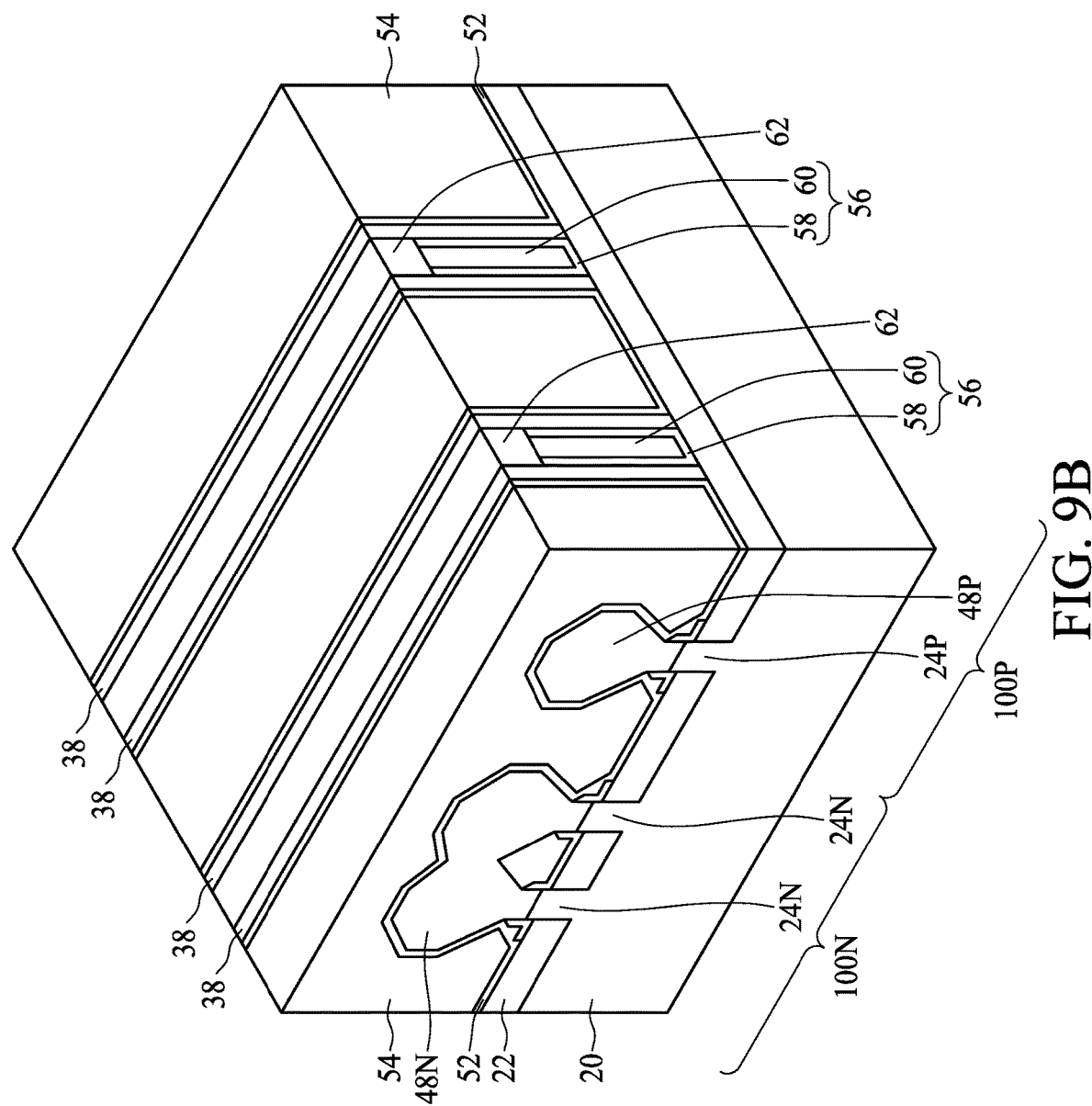

The dummy gate stacks 30 (FIGS. 3A and 4B) are replaced with replacement gate stacks 56 as shown in FIG. 9B. The respective process is illustrated as process 226 in the process flow shown in FIG. 14. It is appreciated that the illustrated epitaxy region 48P is shown as formed based on a single-fin fin-group, while it may also be formed based on a two-fin fin group as shown in FIG. 9A. Replacement gate stacks 56 include gate dielectrics 58, which further include interfacial layers 58A (FIG. 11B) on the top surfaces and sidewalls of protruding fins 24', and high-k dielectrics 58B (FIG. 11B) on the interfacial layers 58A. Replacement gate stacks 56 further include gate electrodes 60 over high-k dielectrics 58B. Referring back to FIG. 9B, after the formation of replacement gate stacks 56, replacement gate stacks 56 are recessed to form trenches between gate spacers 38. A dielectric material such as silicon nitride, silicon oxynitride, or the like, is filled into the resulting trenches to form hard masks 62 (FIG. 9B).

Figure 10:
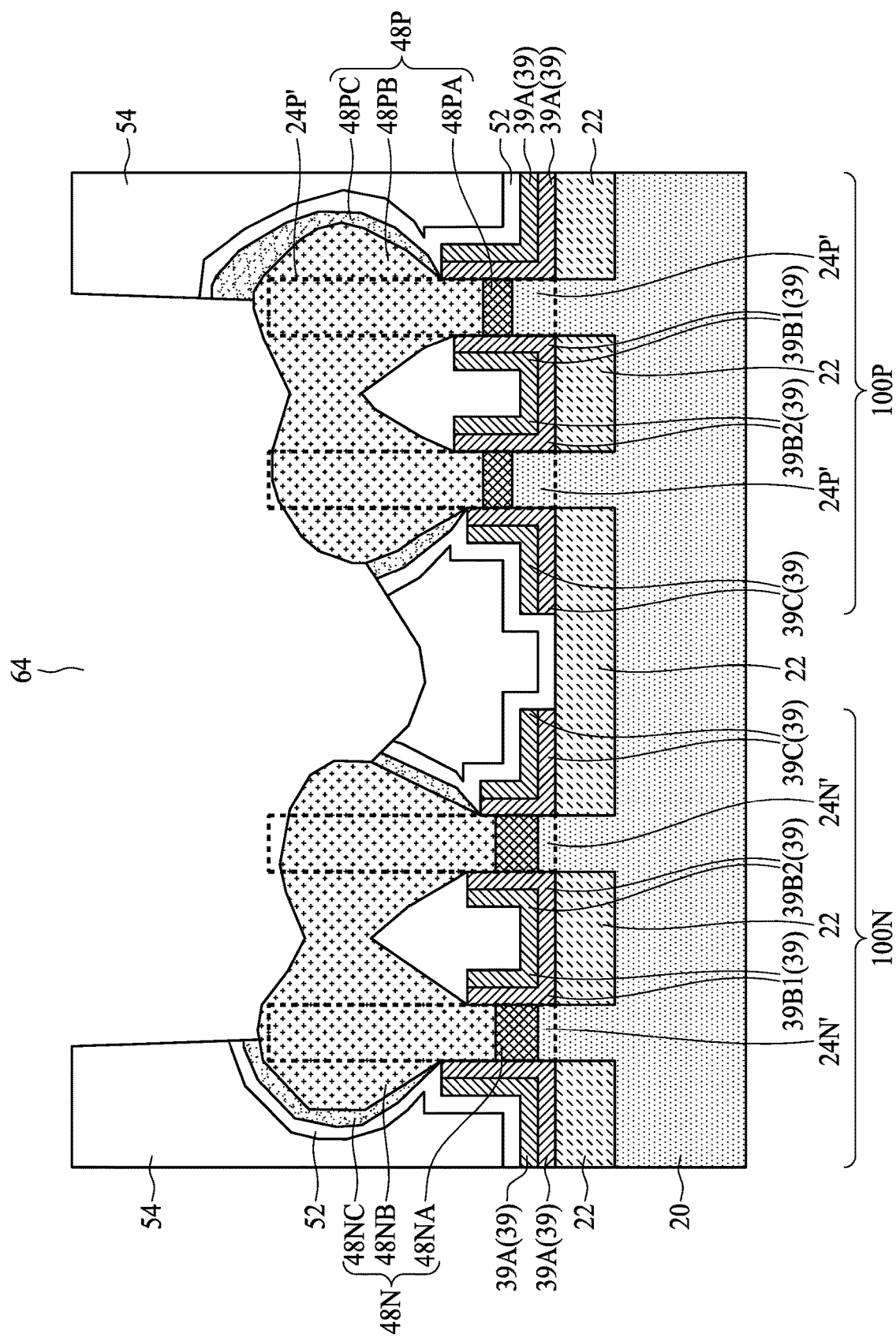

Next, referring to FIG. 10, ILD 54 and CESL 52 are etched to form source/drain contact opening 64. The respective process is illustrated as process 228 in the process flow shown in FIG. 14. Epitaxy layers 48NC and 48PC are also etched-through, and the top surfaces of epitaxy layers 48NB and 48PB are exposed. The etching may be controlled to stop on epitaxy layers 48NB and 48PB, with the over-etching of epitaxy layers 48NB and 48PB being small. For example, the opening 64 may extend into epitaxy regions 48NB and 48PB for a depth in the range between about 1 nm and about 3 nm. The exposed top surface of epitaxy layers 48NB and 48PB are wavy, with the middle portion being recessed lower than the opposing portions on the opposite sides of the middle portion, so that the exposed top surfaces of epitaxy layers 48NB and 48PB have V-shapes in the cross-sectional view. The etching of ILD 54 is controlled so that opening 64 extends down, and some side corners of epitaxy regions 48NC and 48PC are also etched, and the sidewalls of epitaxy layers 48NB and 48PB are exposed, and some side corner portions may be removed. Since the top surfaces of the inner portions of epitaxy regions 48N and 48P are lower than the top surfaces of the respective outer portions, it is easier to clean the bottom portion of opening 64.

Figure 11A:
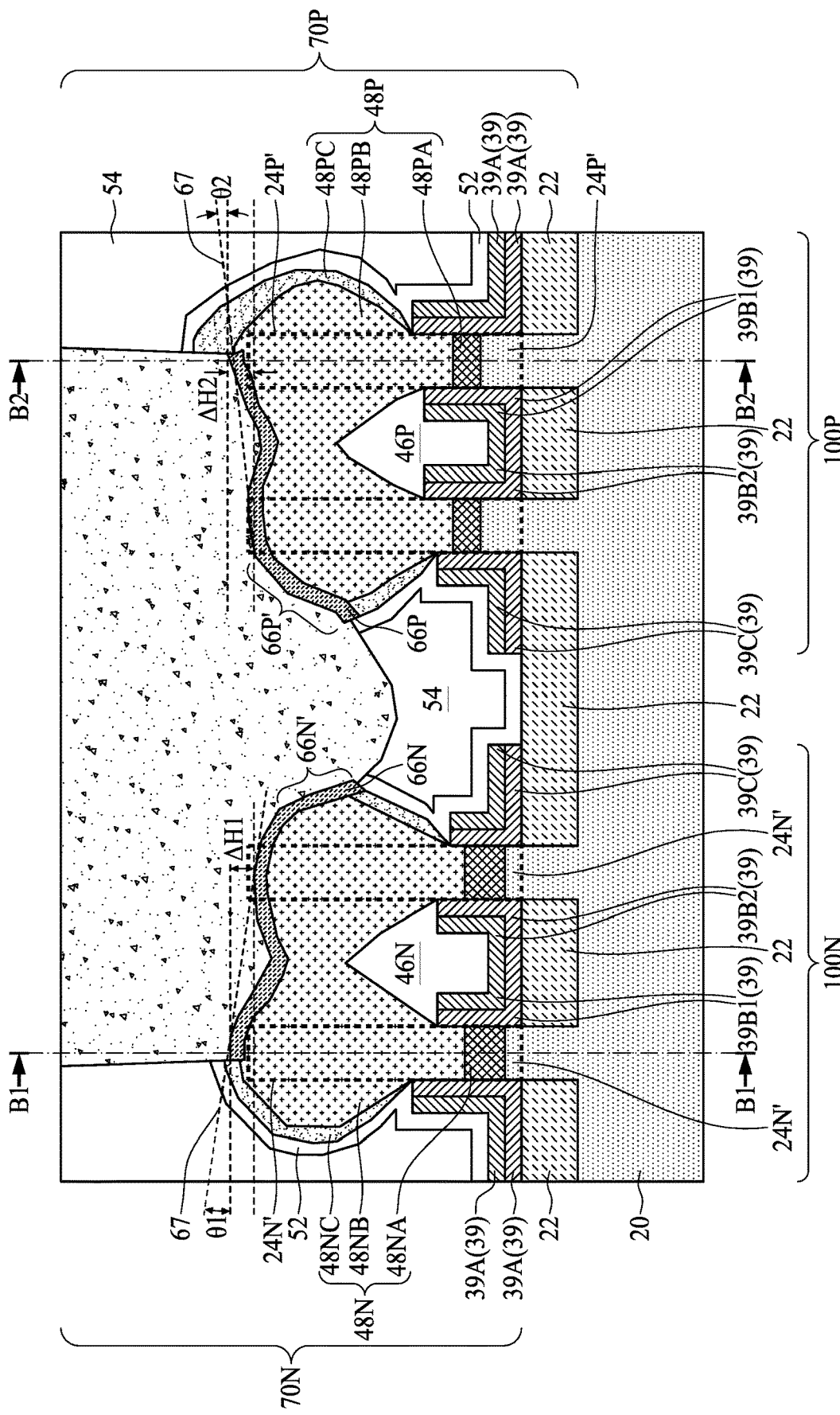
Figure 11B:
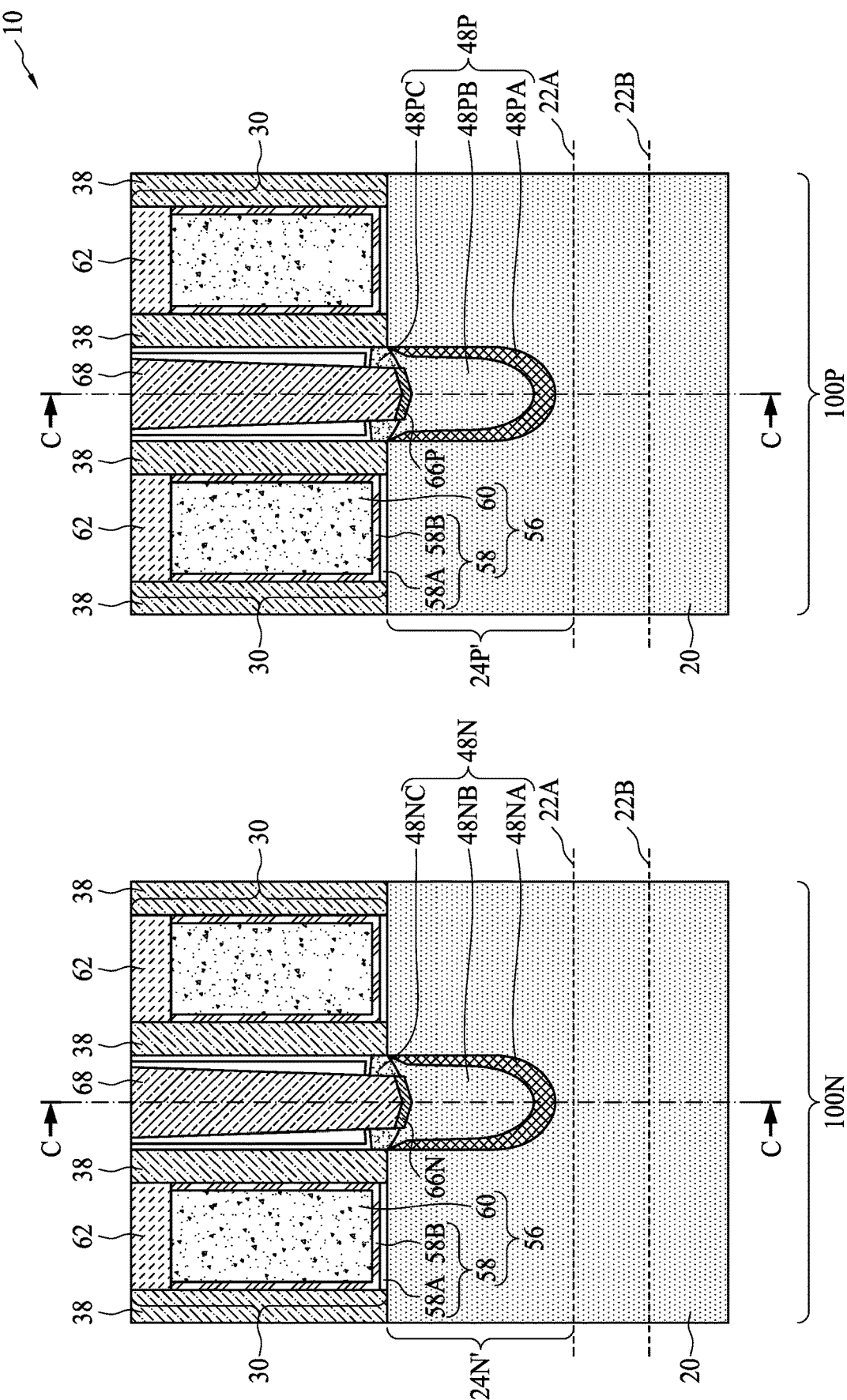

Next, as shown in FIGS. 11A and 11B, source/drain silicide regions 66N and 66P are formed. The respective process is illustrated as process 230 in the process flow shown in FIG. 14. FIG. 11B illustrates the cross-sectional views in reference cross-sections B1-B1 and B2-B2 in FIG. 11A, and FIG. 11A illustrates the cross-sectional views in reference cross-sections C-C in FIG. 11B. The reference cross-sections B1-B1, B2-B2, C-C are also the same as in FIG. 3A. In accordance with some embodiments of the present disclosure, the formation of the source/drain silicide regions 66N and 66P includes depositing a metal layer such as a titanium layer, a cobalt layer, or the like, which extending into opening 64 (FIG. 10), and then performing an annealing process so that the bottom portions of the metal layer react with epitaxy layers 48NB and 48PB to form the silicide regions 66N and 66P, respectively. The remaining un-reacted metal layer may be removed. Source/drain contact plug 68 is then formed in trench 64, and is electrically connected to both source/drain silicide regions 66N and 66P. The respective process is illustrated as process 232 in the process flow shown in FIG. 14. N-type FinFET 70N and p-type FinFET 70P are thus formed, and the source/drain regions 48N and 48P are electrically interconnected by contact plug 68.

As shown in FIG. 11A, the top surface of each of epitaxy regions 48P and 48N is asymmetric and tilted, with the inner portions having top surfaces lower than the respective outer potions. Silicide regions 66N and 66P are accordingly tilted. In accordance with some embodiments, the top surface of the inner portion of each of silicide regions 66N and 66P is lower than the respective outer portion by height difference ΔH1 and ΔH2, which may be greater than about 2 nm, and may be in the range between about 2 nm and about 10 nm. Also, if tangent lines 67 are made on the top surfaces of silicide regions 66N and 66P, the tilt angles θ1 and θ2 may be greater than about 6 degrees, and may be in the range between about 6 degrees and about 45 degrees, or in the range between about 20 degrees and about 45 degrees.

It is observed that by forming asymmetric profiles for epitaxy regions 48N and 48P, and by making the inner portions of epitaxy regions to be lower than the respective outer portions, silicide side portions 66N' and 66P' are formed (and are enlarged) in addition to the portions of silicide regions 66N and 66P directly over epitaxy regions 48N and 48P. This results in the increase in the contact area and the reduction of contact resistance. As a comparison, if epitaxy regions 48N and 48P are formed as having symmetric profiles, portions 66N' and 66P' of silicide regions may not be formed or may be smaller, and the contact area and contact resistance will be higher.

In the above-discussed example, an n-type source/drain region and a p-type source/drain region are discussed and illustrated as an example. In accordance with other embodiments, both FinFETs may be n-type FinFETs or p-type FinFETs. The Figures are similar to what are shown in FIG. 11A, except the two n-type FinFETs or p-type FinFETs will be more flip-symmetric. Also, one of the fin-groups may be a single-fin fin-group, while the other may be a multi-fin-group. Although two-fin fin-groups are used as an example, a fin-group may include three fins or more fins. In addition, although in the above-discussed example, p-type epitaxy regions are formed before the formation of n-type epitaxy region, n-type epitaxy regions may also be formed before the formation of p-type epitaxy regions in accordance with alternative embodiments.

Figure 12:
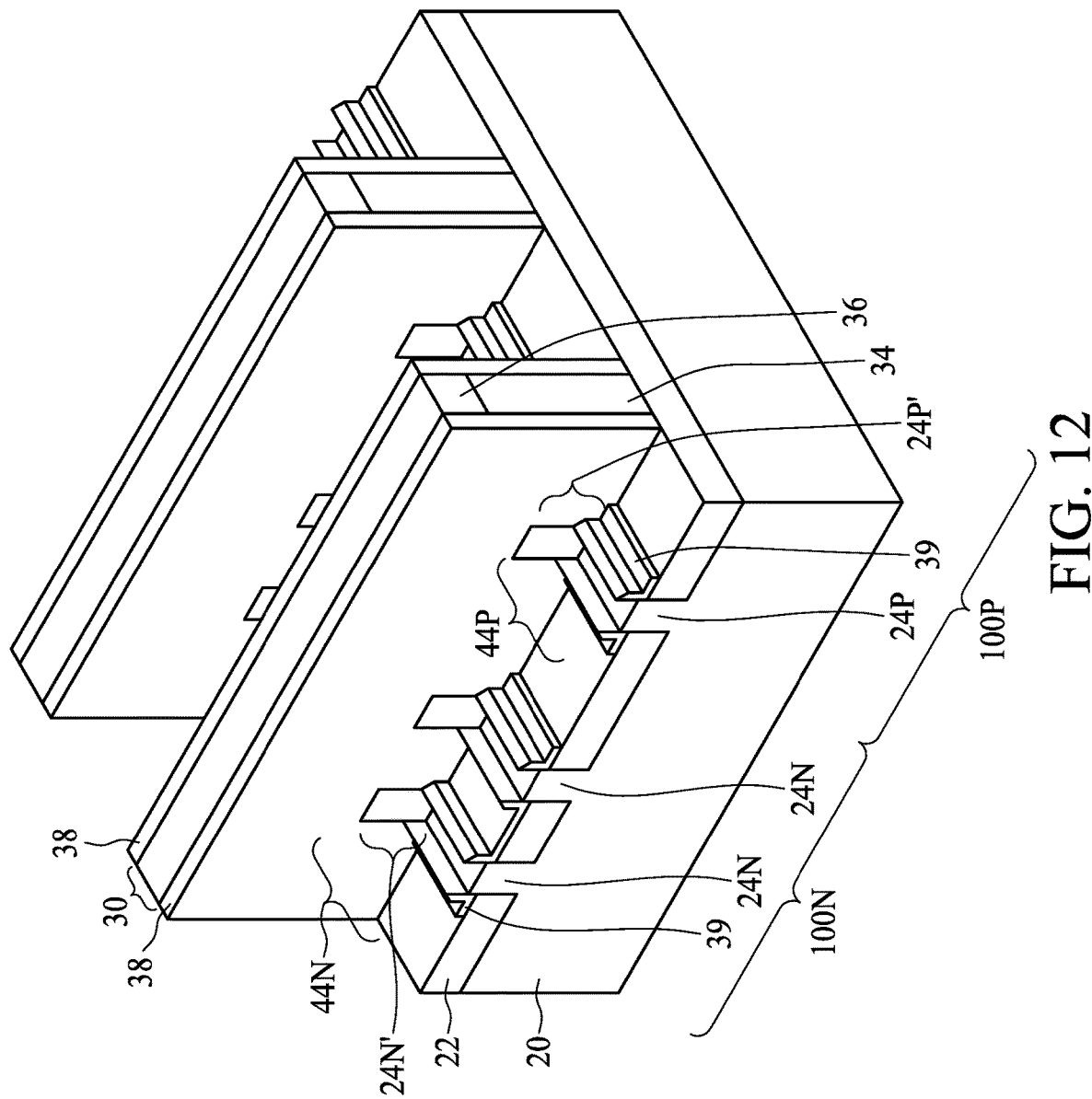
FIG. 12 illustrates a perspective view of the recesses in semiconductor fins in accordance with some embodiments.

FIG. 12 illustrates the perspective view of a structure, with recesses 44N and 44P, and protruding fins 24N' and 24P' being illustrated. It is appreciated that recesses 44N and 44P may be formed in a same etching process, and hence may co-exist at the same time. Alternatively, recesses 44N and 44P may be formed by different processes, and thus may not exist at the same time points, as shown in FIGS. 4A and 6.

Figure 13:
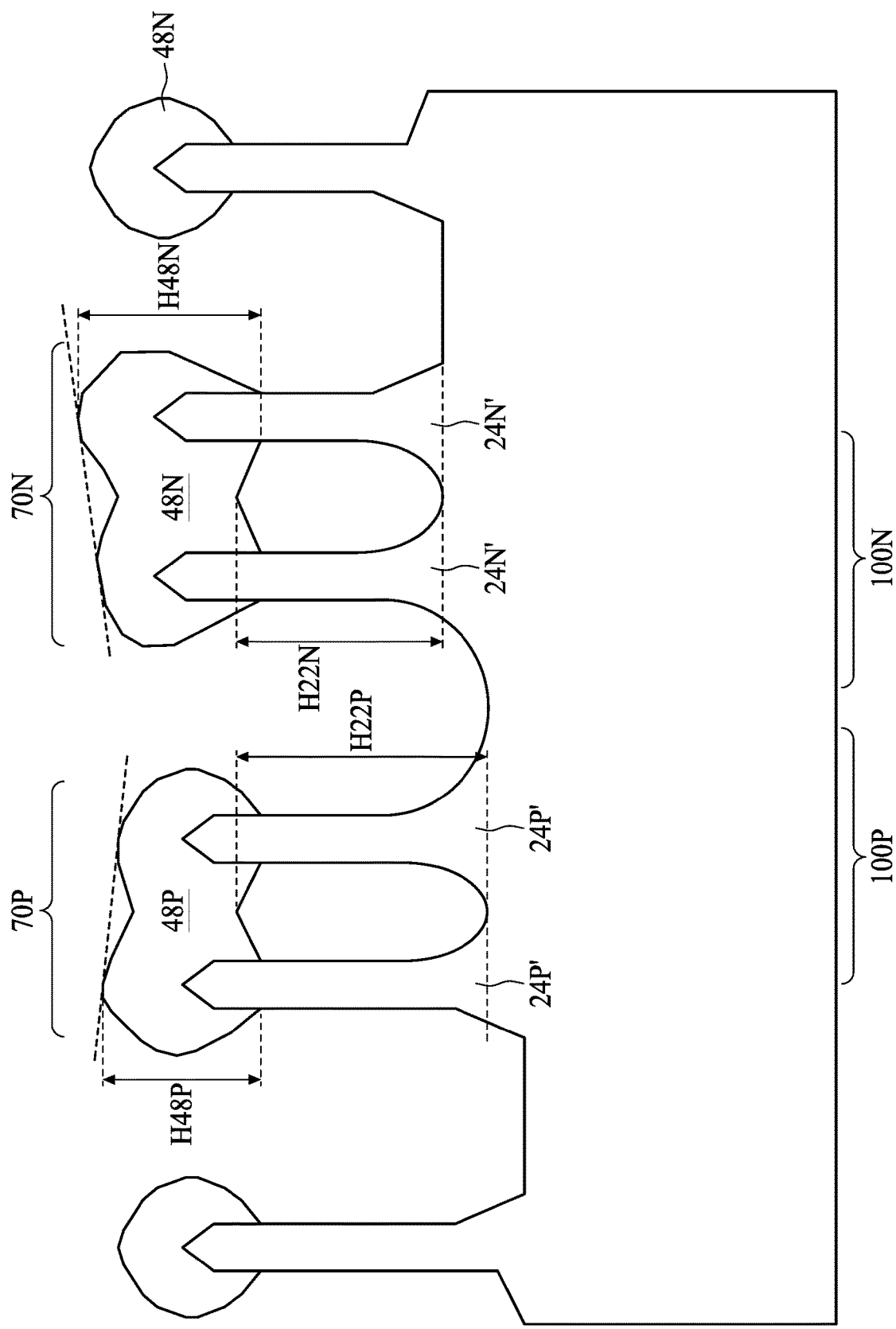
FIG. 13 illustrates a perspective view of a structure with Shallow Trench Isolation (STI) regions and semiconductor fins in accordance with some embodiments.

FIG. 13 illustrates a schematic view of an n-type FinFET 70N and p-type FinFET 70P. Silicide regions and contact plugs are not shown. The epitaxy region 48N of the n-type FinFET 70N and the epitaxy region 48P of p-type FinFET 70P also have asymmetric profiles. In accordance with some embodiments, the height H48N of epitaxy regions 48N are greater than the height H48P of epitaxy regions 48P. Also, the height H22N of the STI regions 22N in the inner-group spacing of the corresponding fin-group in n-type FinFET 70N are shallower than the STI regions 22P in the inner-group spacing of the corresponding fin-group in p-type FinFET 70P.

In the example as shown in FIG. 13, the portion of epitaxy region 48P on the inner fin facing toward epitaxy region 48N is shorter than the portion of epitaxy region 48P on the outer fin facing away from epitaxy region 48N. The portion of epitaxy region 48N on the inner fin facing toward epitaxy region 48P is shorter than the portion of epitaxy region 48N on the outer fin facing away from epitaxy region 48P. In accordance with other embodiments, the portion of epitaxy region 48P on the inner fin facing toward epitaxy region 48N may be taller than the portion of epitaxy region 48P on the outer fin facing away from epitaxy region 48N. The portion of epitaxy region 48N on the inner fin facing toward epitaxy region 48P may also be taller than the portion of epitaxy region 48N on the outer fin facing away from epitaxy region 48P. These embodiments may be achieved by forming the illustrated epitaxy region 48N simultaneously as another n-type epitaxy region (not shown) on its right side in a first formation process, and forming the illustrated epitaxy region 48P simultaneously as another p-type epitaxy region (not shown) on its left side in a second formation process.

The embodiments of the present disclosure have some advantageous features. By forming epitaxy regions with asymmetric profiles, the source/drain silicide regions may extend to the sidewalls of the respective epitaxy source/drain regions, so that the contact resistance is reduced. Furthermore, with the inner portions of the epitaxy regions being shorter, it is easy to perform cleaning bottoms of openings.

In accordance with some embodiments of the present disclosure, a method comprises forming isolation regions extending into a semiconductor substrate; forming a first plurality of protruding fins and a second protruding fin over the isolation regions, wherein the first plurality of protruding fins comprise an outer fin farthest from the second protruding fin, and an inner fin closest to the second protruding fin; etching the first plurality of protruding fins to form first recesses; growing first epitaxy regions from the first recesses, wherein the first epitaxy regions are merged to form a merged epitaxy region; etching the second protruding fin to form a second recess; and growing a second epitaxy region from the second recess, wherein a top surface of the merged epitaxy region is lower on a side facing toward the second epitaxy region than on a side facing away from the second epitaxy region. In an embodiment, the method further comprises forming a plurality of fin spacers on sidewalls of the first plurality of protruding fins, wherein the plurality of fin spacers comprise a first outer fin spacer facing toward the second epitaxy region, and a second outer fin spacer facing away from the second epitaxy region, wherein the second outer fin spacer is taller than the first outer fin spacer. In an embodiment, the first outer fin spacer and the second outer fin spacer have bottoms contacting top surfaces of the isolation regions. In an embodiment, the plurality of fin spacers further comprise inner fin spacers between neighboring fins in the first plurality of protruding fins, wherein the inner fin spacers are shorter than the second outer fin spacer and taller than the first outer fin spacer. In an embodiment, the inner fin and the outer fin overlap an inner semiconductor strip and an outer semiconductor strip, respectively, and wherein the first epitaxy regions comprise: an outer portion directly over the outer semiconductor strip, and an inner portion directly over the inner semiconductor strip, wherein the outer portion has a first raised height higher than a second raised height of the inner portion. In an embodiment, the first recesses have bottoms higher than top surfaces of the isolation regions. In an embodiment, the method further comprises forming a first silicide region on the merged epitaxy region, wherein the first silicide region is tilted, with a first portion of the first silicide region closer to the second epitaxy region being lower than a second portion of the first silicide region farther away from the second epitaxy region. In an embodiment, the method further comprises forming a second silicide region on the second epitaxy region; and forming a contact plug joining to both of the first silicide region and the second silicide region.

In accordance with some embodiments of the present disclosure, a device comprises a semiconductor substrate; a first plurality of isolation regions and a second plurality of isolation regions extending into the semiconductor substrate; a first strip group comprising a first plurality of semiconductor strips between the first plurality of isolation regions; a second strip group comprising at least one second semiconductor strip between the second plurality of isolation regions; a first fin-group comprising a first plurality of semiconductor fins overlapping the corresponding first plurality of semiconductor strips; a second fin-group comprising at least one second semiconductor fin overlapping the at least one second semiconductor strip; a plurality of epitaxy regions, each comprising a portion filling a first recess in one of the first plurality of semiconductor fins, wherein the plurality of epitaxy regions are merged to form a merged epitaxy region; and a second epitaxy region comprising a second portion filling a second recess in the at least one second semiconductor fin, wherein a top surface of the merged epitaxy region is tilted toward the second epitaxy region, with first portions of the top surface closer to the second epitaxy region being lower than second portions of the top surface farther away from the second epitaxy region. In an embodiment, the first plurality of semiconductor strips comprise an outer strip farthest from the second fin-group, and an inner strip closest to the second fin-group, wherein an outer portion of the merged epitaxy region overlapping the outer strip is taller than an inner portion of the merged epitaxy region overlapping the inner strip. In an embodiment, the merged epitaxy region is of a first conductivity type, and the second epitaxy region is of a second conductivity type opposite to the first conductivity type. In an embodiment, the merged epitaxy region and the second epitaxy region are of a same conductivity type. In an embodiment, the device further comprises a first silicide region on the merged epitaxy region, wherein the first silicide region is tilted, with first parts of the first silicide region closer to the second epitaxy region being lower than second parts of the first silicide region farther away from the second epitaxy region. In an embodiment, the device further comprises a second silicide region on the second epitaxy region, wherein the second silicide region is tilted toward the first silicide region; and a contact plug joining to both of the first silicide region and the second silicide region. In an embodiment, the device further comprises a plurality of fin spacers on sidewalls of the first plurality of semiconductor fins, wherein the plurality of fin spacers comprise a first outer fin spacer facing toward the second epitaxy region, and a second outer fin spacer facing away from the second epitaxy region, wherein the second outer fin spacer is taller than the first outer fin spacer. In an embodiment, the plurality of fin spacers further comprise inner fin spacers between neighboring fins in the first plurality of semiconductor fins, wherein the inner fin spacers have heights smaller than the second outer fin spacer and greater than the first outer fin spacer.

In accordance with some embodiments of the present disclosure, a device comprises a plurality of semiconductor fins; a plurality of gate stacks on top surfaces and sidewalls of the plurality of semiconductor fins; a plurality of epitaxy regions, each being between, and joining sidewalls of, two of the plurality of semiconductor fins, wherein the plurality of epitaxy regions are merged as a merged epitaxy region, and an outmost epitaxy region in the plurality of epitaxy regions is shortest among the plurality of epitaxy regions; a silicide region contacting a top surface of the merged epitaxy region; and a contact plug over and contacting the silicide region. In an embodiment, the device further comprises an additional epitaxy region neighboring the merged epitaxy region, wherein the outmost epitaxy region is closest to the additional epitaxy region among the plurality of epitaxy regions; and a second silicide region contacting an additional top surface of the additional epitaxy region, wherein the contact plug further contacts the second silicide region. In an embodiment, the device further comprises a plurality of fin spacers on sidewalls of the plurality of epitaxy regions, wherein the plurality of fin spacers comprise a first outer fin spacer on a sidewall of an outmost fin in the plurality of semiconductor fins, and a second outer fin spacer on an opposite side of the plurality of semiconductor fins than the first outer fin spacer, wherein the first outer fin spacer is taller than the second outer fin spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming isolation regions extending into a semiconductor substrate;
    forming a first plurality of protruding fins and a second protruding fin over the isolation regions, wherein the first plurality of protruding fins comprise an outer fin farthest from the second protruding fin, and an inner fin closest to the second protruding fin;
    etching the first plurality of protruding fins to form first recesses;
    growing first epitaxy regions from the first recesses, wherein the first epitaxy regions are merged to form a merged epitaxy region;
    etching the second protruding fin to form a second recess; and
    growing a second epitaxy region from the second recess, wherein a top surface of the merged epitaxy region is lower on a side facing toward the second epitaxy region than on a side facing away from the second epitaxy region; and
    forming a plurality of fin spacers on sidewalls of the first plurality of protruding fins, wherein the plurality of fin spacers comprise:
        a first outer fin spacer facing toward the second epitaxy region;
        a second outer fin spacer facing away from the second epitaxy region; and
        inner fin spacers between neighboring fins in the first plurality of protruding fins, wherein the inner fin spacers are shorter than the second outer fin spacer and taller than the first outer fin spacer.

2. The method of claim 1, wherein the first fin spacer is shortest among the plurality of fin spacers.

3. The method of claim 1, wherein the first outer fin spacer and the second outer fin spacer have bottoms contacting top surfaces of the isolation regions.

4. The method of claim 1, wherein the inner fin and the outer fin overlap an inner semiconductor strip and an outer semiconductor strip, respectively, and wherein the first epitaxy regions comprise:
an outer portion directly over the outer semiconductor strip, and an inner portion directly over the inner semiconductor strip, wherein the outer portion has a first raised height higher than a second raised height of the inner portion.

5. The method of claim 1, wherein the first recesses have bottoms higher than top surfaces of the isolation regions.

6. The method of claim 1, further comprising forming a first silicide region on the merged epitaxy region, wherein the first silicide region is tilted, with a first portion of the first silicide region closer to the second epitaxy region being lower than a second portion of the first silicide region farther away from the second epitaxy region.

7. The method of claim 6, wherein a tangent line formed on an additional top surface of the first silicide region has a tilt angle greater than about 6 degrees.

8. The method of claim 6, further comprising:
forming a second silicide region on the second epitaxy region; and
forming a contact plug joining to both of the first silicide region and the second silicide region.

9. A device comprising:
a semiconductor substrate;
a first plurality of isolation regions and a second plurality of isolation regions extending into the semiconductor substrate;
a first strip group comprising a first plurality of semiconductor strips between the first plurality of isolation regions;
a second strip group comprising at least one second semiconductor strip between the second plurality of isolation regions;
a first fin-group comprising a first plurality of semiconductor fins overlapping the corresponding first plurality of semiconductor strips;
a second fin-group comprising at least one second semiconductor fin overlapping the at least one second semiconductor strip;
a plurality of epitaxy regions, each comprising a portion filling a first recess extending into one of the first plurality of semiconductor fins, wherein the plurality of epitaxy regions are merged to form a merged epitaxy region; and
a second epitaxy region comprising a second portion filling a second recess extending into the at least one second semiconductor fin, wherein a top surface of the merged epitaxy region is tilted toward the second epitaxy region, with first portions of the top surface closer to the second epitaxy region being lower than second portions of the top surface farther away from the second epitaxy region, wherein the first portions of the top surface overlap an inner strip in the first plurality of semiconductor strips, and wherein a first isolation region in the first plurality of isolation regions is continuously joined to a second isolation region in the second plurality of isolation regions to form a continuous isolation region, and wherein the continuous isolation region physically joins a sidewall of the inner strip.

10. The device of claim 9, wherein the first plurality of semiconductor strips comprise an outer strip farthest from the second fin-group, wherein an outer portion of the merged epitaxy region overlapping the outer strip is taller than an inner portion of the merged epitaxy region overlapping the inner strip.

11. The device of claim 9, wherein the merged epitaxy region is of a first conductivity type, and the second epitaxy region is of a second conductivity type opposite to the first conductivity type.

12. The device of claim 9, wherein the merged epitaxy region and the second epitaxy region are of a same conductivity type.

13. The device of claim 9, further comprising a first silicide region on the merged epitaxy region, wherein the first silicide region is tilted, with first parts of the first silicide region closer to the second epitaxy region being lower than second parts of the first silicide region farther away from the second epitaxy region.

14. The device of claim 13, further comprising:
a second silicide region on the second epitaxy region, wherein the second silicide region is tilted toward the first silicide region; and
a contact plug joining to both of the first silicide region and the second silicide region.

15. The device of claim 9, further comprising:
a plurality of fin spacers on sidewalls of the first plurality of semiconductor fins, wherein the plurality of fin spacers comprise a first outer fin spacer facing toward the second epitaxy region, and a second outer fin spacer facing away from the second epitaxy region, wherein the second outer fin spacer is taller than the first outer fin spacer.

16. The device of claim 15, wherein the plurality of fin spacers further comprise inner fin spacers between neighboring fins in the first plurality of semiconductor fins, wherein the inner fin spacers have heights smaller than the second outer fin spacer and greater than the first outer fin spacer.

17. A device comprising:
a plurality of semiconductor fins;
a plurality of gate stacks on top surfaces and sidewalls of the plurality of semiconductor fins;
a plurality of epitaxy regions, each being between, and joining sidewalls of, two of the plurality of semiconductor fins, wherein the plurality of epitaxy regions are merged as a merged epitaxy region, and a topmost point of an outmost epitaxy region in the plurality of epitaxy regions is shortest among topmost points of all of the plurality of epitaxy regions;
a silicide region contacting a top surface of the merged epitaxy region; and
a contact plug over and contacting the silicide region.

18. The device of claim 17, further comprising:
an additional epitaxy region neighboring the merged epitaxy region, wherein the outmost epitaxy region is closest to the additional epitaxy region among the plurality of epitaxy regions; and
a second silicide region contacting an additional top surface of the additional epitaxy region, wherein the contact plug further contacts the second silicide region.

19. The device of claim 17, further comprising:
a plurality of fin spacers on sidewalls of the plurality of epitaxy regions, wherein the plurality of fin spacers comprise a first outer fin spacer on a sidewall of an outmost fin in the plurality of semiconductor fins, and a second outer fin spacer on an opposite side of the plurality of semiconductor fins than the first outer fin spacer, wherein the first outer fin spacer is taller than the second outer fin spacer.

\* \* \* \* \*